(12) United States Patent
Yamashita et al.

(10) Patent No.: US 11,830,890 B2
(45) Date of Patent: Nov. 28, 2023

(54) IMAGE SENSOR, IMAGE CAPTURING APPARATUS AND IMAGE PROCESSING APPARATUS

(71) Applicant: CANON KABUSHIKI KAISHA, Tokyo (JP)

(72) Inventors: Yusuke Yamashita, Kawasaki (JP); Koki Nakamura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/982,167

(22) Filed: Nov. 7, 2022

(65) Prior Publication Data

US 2023/0059164 A1    Feb. 23, 2023

Related U.S. Application Data

(60) Continuation of application No. 17/393,610, filed on Aug. 4, 2021, now Pat. No. 11,515,344, which is a (Continued)

(30) Foreign Application Priority Data

| Apr. 16, 2018 | (JP) | 2018-078625 |
| Feb. 8, 2019 | (JP) | 2019-021823 |
| Feb. 8, 2019 | (JP) | 2019-021825 |

(51) Int. Cl.
*H01L 27/146* (2006.01)
*H04N 23/67* (2023.01)
(Continued)

(52) U.S. Cl.
CPC .. *H01L 27/14605* (2013.01); *H01L 27/14627* (2013.01); *H04N 23/67* (2023.01); *H04N 25/40* (2023.01); *H04N 25/772* (2023.01)

(58) Field of Classification Search
CPC ........ H01L 27/14605; H01L 27/14627; H04N 23/67; H04N 25/40; H04N 25/772;
(Continued)

(56) References Cited

U.S. PATENT DOCUMENTS

| 11,350,044 B2 * | 5/2022 | Mori ................... H04N 25/771 |
| 2014/0022401 A1 * | 1/2014 | Awatani ............... H04N 25/585 |
| | | 348/207.11 |

(Continued)

FOREIGN PATENT DOCUMENTS

| JP | 2001-083407 A | 3/2001 |
| JP | 2005-175517 A | 6/2005 |
| JP | 2017-216638 A | 12/2017 |

OTHER PUBLICATIONS

The above foreign patent document was cited in the Feb. 17, 2023 Japanese Office Action, which is enclosed without an English Translation, that issued in Japanese Patent Application No. 2019-021825.

*Primary Examiner* — Shahbaz Nazrul
(74) *Attorney, Agent, or Firm* — Cowan, Liebowitz & Latman, P.C.

(57) ABSTRACT

An image sensor comprises: a pixel region including a plurality of microlenses arranged in a matrix, and a plurality of photoelectric conversion portions provided for each of the microlenses; a plurality of amplifiers that apply a plurality of different gains to signals output from the pixel region; and a scanning circuit that scans the pixel region so that a partial signal and an added signal are read out, the partial signal being a signal from some of the plurality of photoelectric conversion portions, and the added signal being a signal obtained by adding the signals from the plurality of photoelectric conversion portions.

4 Claims, 26 Drawing Sheets

Related U.S. Application Data division of application No. 16/381,090, filed on Apr. 11, 2019, now Pat. No. 11,133,339.

(51) Int. Cl.
*H04N 25/40* (2023.01)
*H04N 25/772* (2023.01)

(58) Field of Classification Search
CPC ...... H04N 25/585; H04N 25/75; H04N 25/77; H04N 23/672
See application file for complete search history.

(56) References Cited

U.S. PATENT DOCUMENTS

| | | |
|---|---|---|
| 2015/0077603 A1 | 3/2015 | Matsuzawa et al. |
| 2015/0181103 A1 | 6/2015 | Kimura |
| 2015/0316833 A1 | 11/2015 | Watanabe et al. |
| 2016/0127637 A1 | 5/2016 | Takao et al. |
| 2016/0227143 A1 | 8/2016 | Kitamori et al. |
| 2017/0353678 A1 | 12/2017 | Ogushi |
| 2017/0353679 A1 | 12/2017 | Negishi |
| 2017/0359539 A1 | 12/2017 | Kawabata et al. |
| 2017/0374271 A1 | 12/2017 | Takao |
| 2018/0054578 A1 | 2/2018 | Kitamori et al. |
| 2019/0068930 A1* | 2/2019 | Kato .................... G05D 1/0246 |
| 2019/0246054 A1 | 8/2019 | Kobayashi et al. |

* cited by examiner

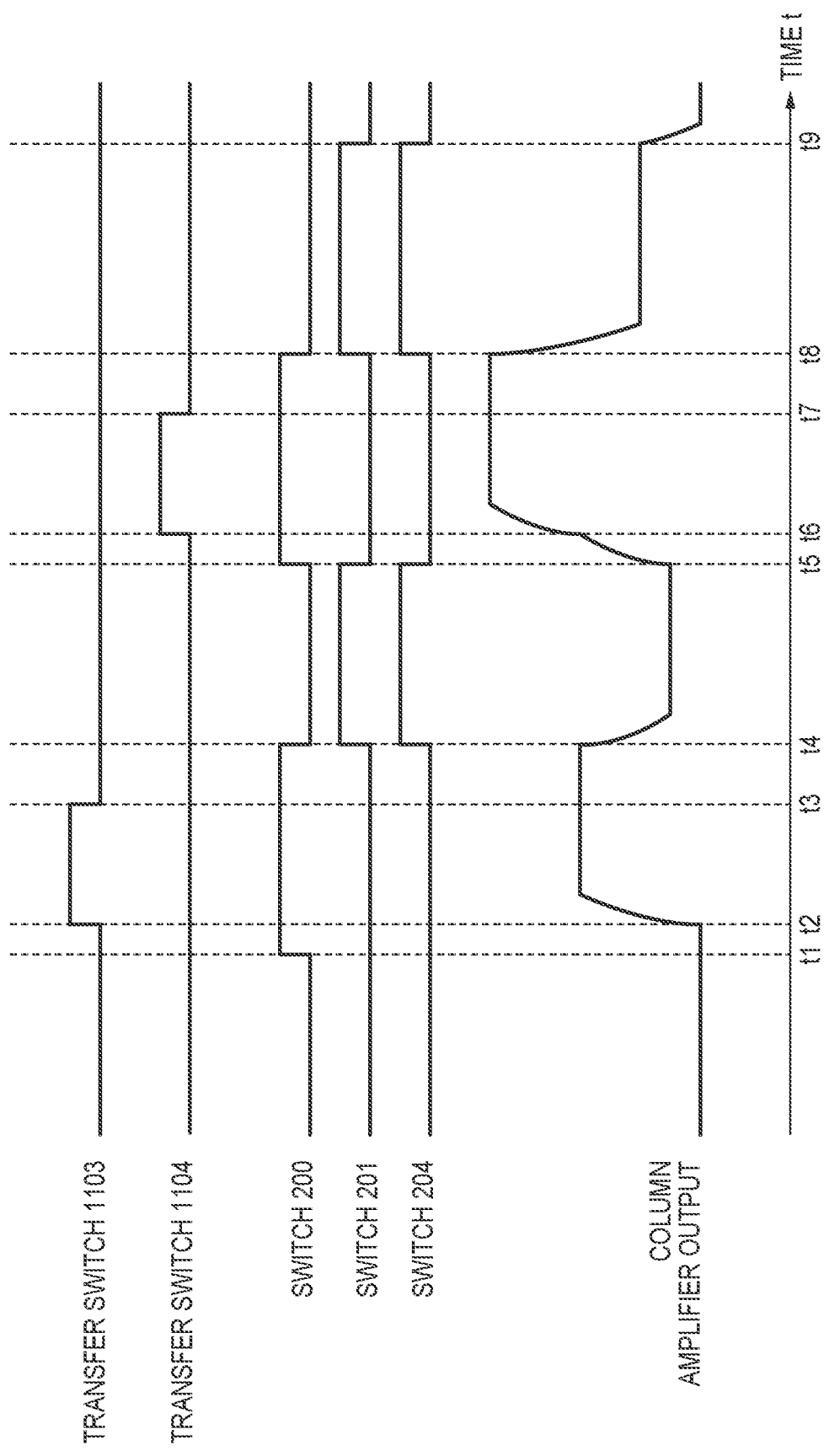

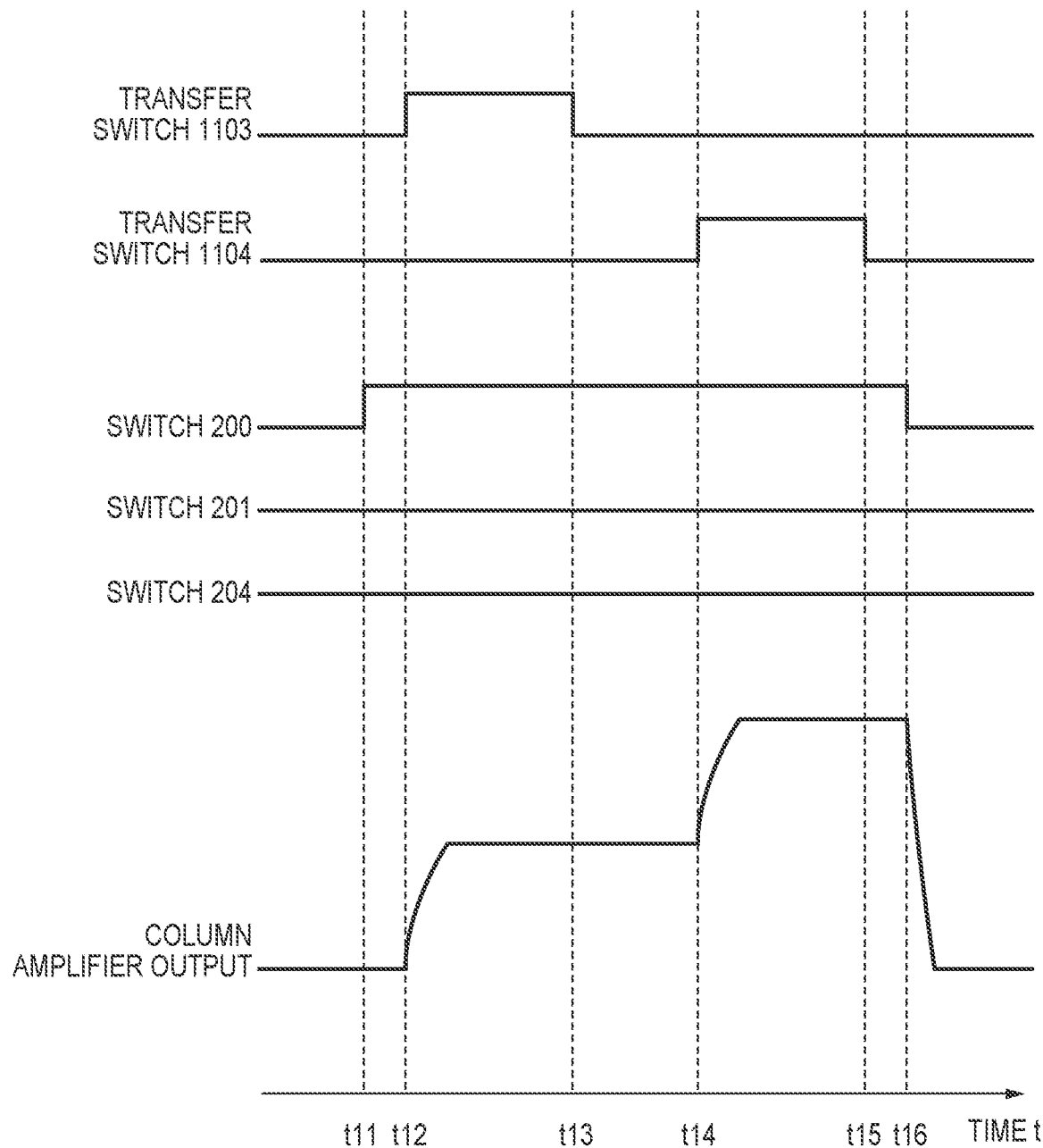

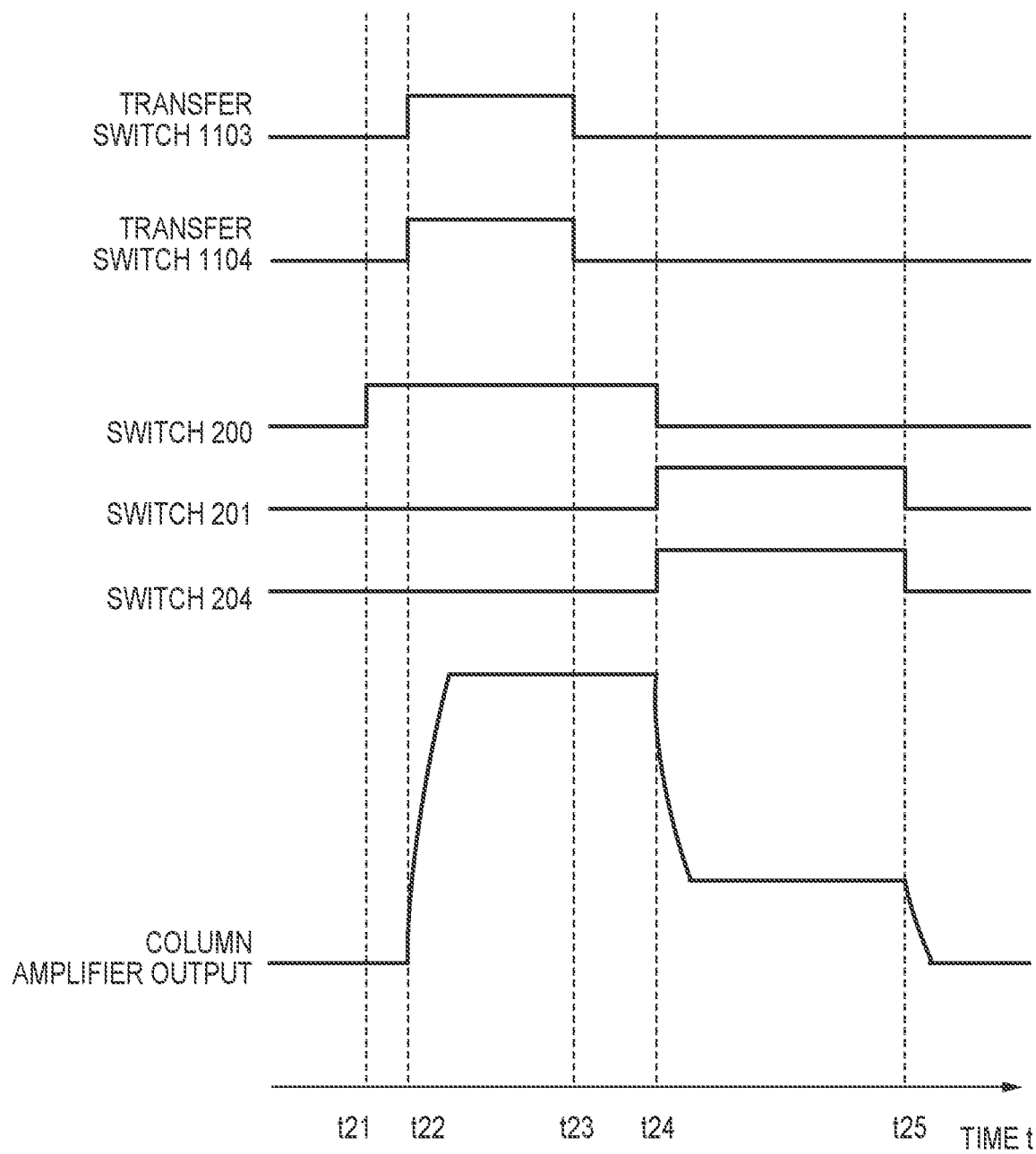

FIG. 12A
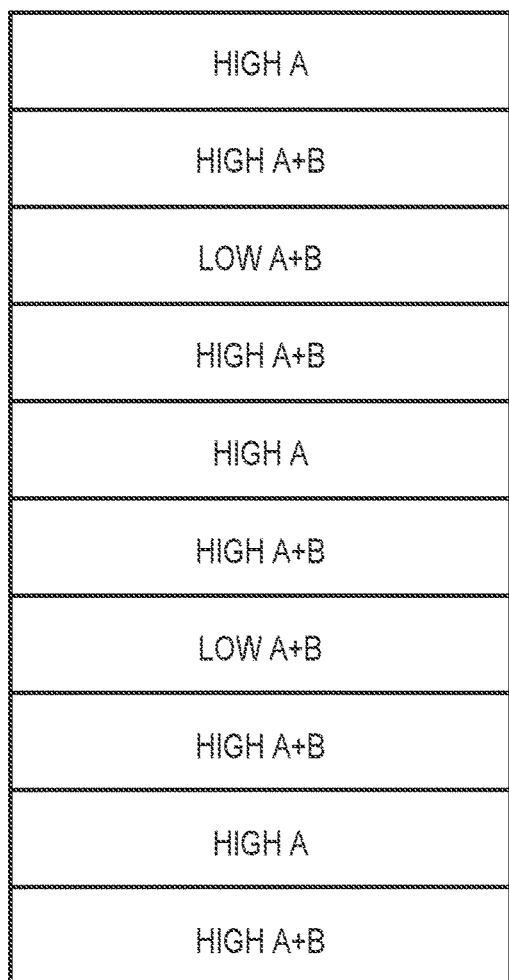
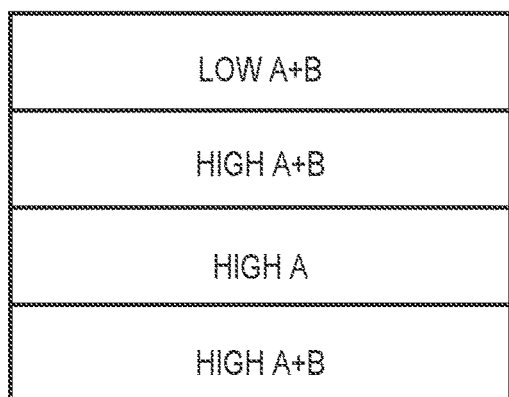
FIG. 12B
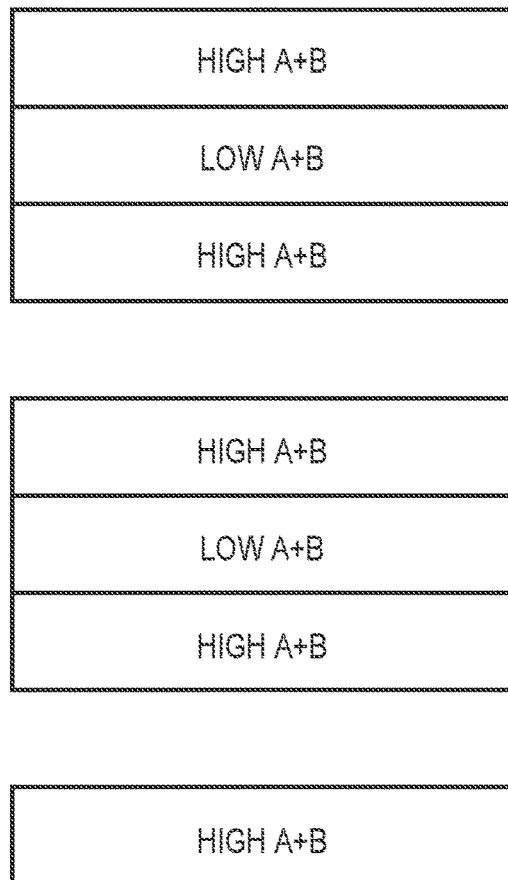
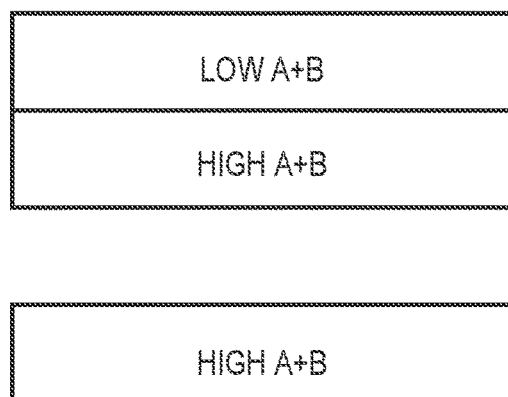

FIG. 12C
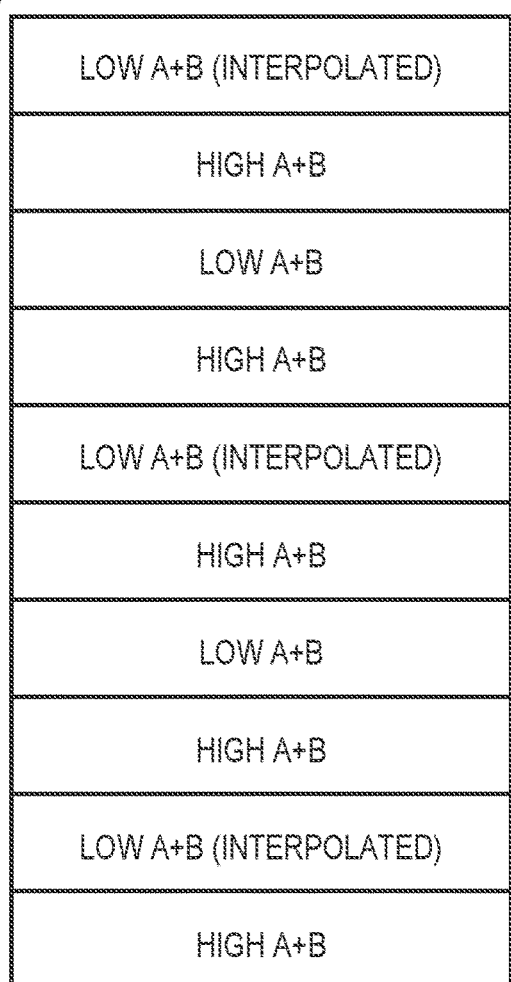
FIG. 12D
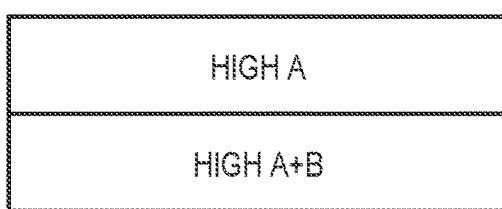
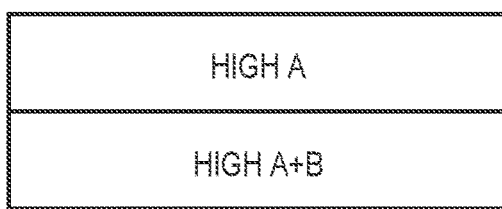
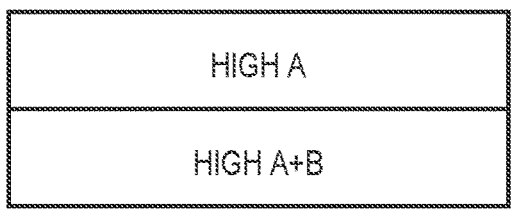
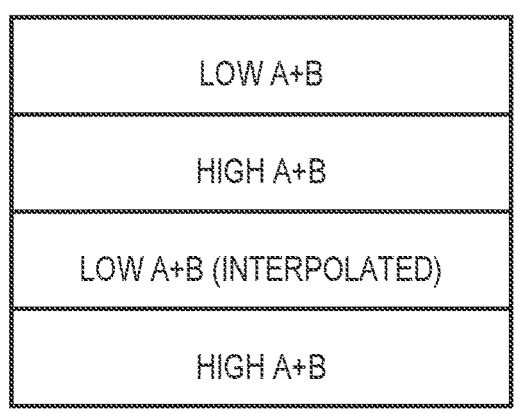
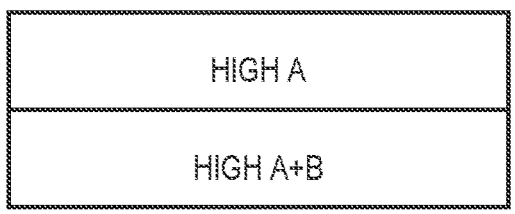

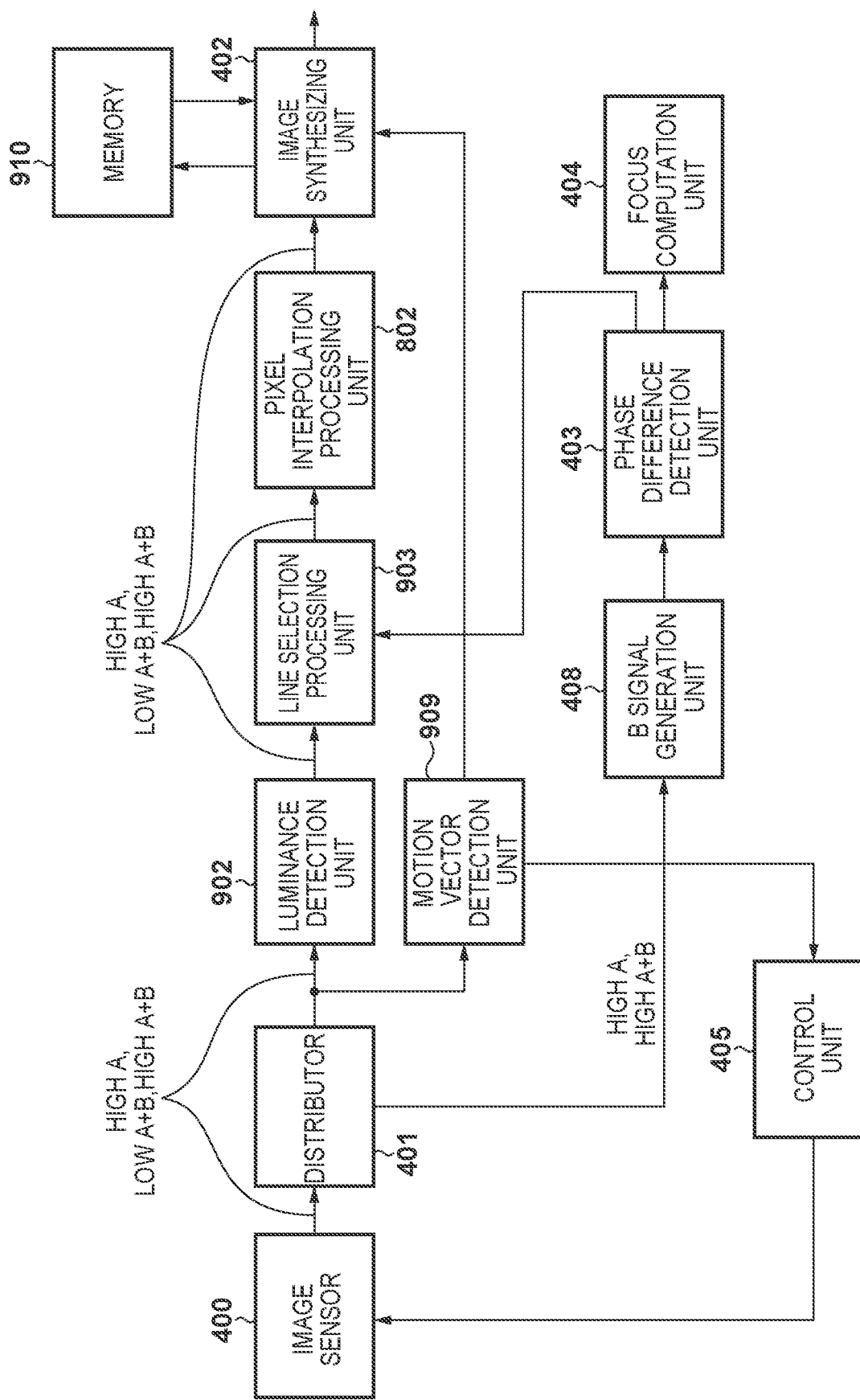
F I G. 15

FIG. 24A

| R<br>A+B | G<br>A+B | R<br>A+B | G<br>A+B |
|---|---|---|---|
| G<br>A+B | B<br>A+B | G<br>A+B | B<br>A+B |

| R<br>A | G<br>A | R<br>A | G<br>A |
|---|---|---|---|
| G<br>A | B<br>A | G<br>A | B<br>A |

FIG. 24B

| R<br>A+B | G<br>A+B | R<br>A+B | G<br>A+B |
|---|---|---|---|
| G<br>A+B | B<br>A+B | G<br>A+B | B<br>A+B |

| A |
|---|

IMAGE SENSOR, IMAGE CAPTURING APPARATUS AND IMAGE PROCESSING APPARATUS

CROSS-REFERENCE TO RELATED APPLICATION

This application is a continuation of application Ser. No. 17/393,610, filed Aug. 4, 2021, which is a divisional of application Ser. No. 16/381,090, filed Apr. 11, 2019, which issued as U.S. Pat. No. 11,133,339 on Sep. 28, 2021, the entire disclosures of which are hereby incorporated by reference.

BACKGROUND OF THE INVENTION

Field of the Invention

The present invention relates to an image sensor, an image capturing apparatus and an image processing apparatus.

Description of the Related Art

Recently, techniques have been proposed in which an image sensor not only simply outputs image signals obtained through photoelectric conversion in pixels, but also expands the dynamic range, outputs information indicating the distance to an object, and the like, for example. Japanese Patent Laid-Open No. 2005-175517 proposes a technique that provides a function for switching the input capacitances of amplifying circuits provided in each column of an image sensor, where the gain is switched in accordance with a signal level. With a configuration that switches the gain as described in Japanese Patent Laid-Open No. 2005-175517, low-gain and high-gain image signals are output and synthesized through image processing carried out at a later stage, which makes it possible to create a high-dynamic range and low-noise image signal.

Meanwhile, a focus detection method using what is known as an on-imaging plane phase difference detection method (on-imaging plane phase difference AF) has been proposed, in which a pair of images having parallax is read out from the image sensor and the focus is detected using a phase difference detection method. An image capturing apparatus in which a pair of photoelectric conversion portions are provided for each of microlenses constituting a microlens array arranged two-dimensionally can be given as an example of an image capturing apparatus outputting signals that can be used in a focus detection method employing the on-imaging plane phase difference detection method. Japanese Patent Laid-Open No. 2001-83407 proposes an image capturing apparatus in which whether or not to add signals output from each of pairs of photoelectric conversion portions, on which light is incident through a single microlens, can be controlled as desired for each pair of photoelectric conversion portions.

However, the way in which high-gain image signals and low-gain image signals for expanding the dynamic range are read out in Japanese Patent Laid-Open No. 2005-175517 is different from the way in which the image signals for phase difference detection are read out in Japanese Patent Laid-Open No. 2001-83407, and those signals cannot be read out in the same frame.

Additionally, consider a situation where, in a single frame, driving for reading out image signals for expanding the dynamic range and driving for reading out image signals for phase difference detection are switched from readout row to readout row of the image sensor in order to maintain a high framerate. In this case, the dynamic range cannot be expanded in rows where the image signals for phase difference detection are read out.

Although it is conceivable to apply high gain and low gain for expanding the dynamic range as per Japanese Patent Laid-Open No. 2005-175517 to the image signals for phase difference detection according to Japanese Patent Laid-Open No. 2001-83407 and read out the signals, the following problem can arise in such a case. With long exposures or in high-temperature environments, factors such as an increase in dark current components, changes in wiring resistances, and the like may cause differences in black levels between the image signals to which different gains have been applied, resulting in an offset shift. If image data obtained through expanding dynamic range synthesizing (HDR synthesizing) and signals for phase difference detection are used in a state where the offset is shifted in this manner, on-imaging plane phase difference AF cannot be applied appropriately.

SUMMARY OF THE INVENTION

Having been made in consideration of the above situation, the present invention reads out, in a short time, image signals necessary for focus detection and/or dynamic range expansion in accordance with the subject being shot and the application of the read-out image signals.

Additionally, the present invention makes it possible to obtain an image signal and a suitable pupil division signal when carrying out dynamic range expansion synthesis.

According to the present invention, provided is an image sensor comprising: a pixel region including a plurality of microlenses arranged in a matrix, and a plurality of photoelectric conversion portions provided for each of the microlenses; a plurality of amplifiers that apply a plurality of different gains to signals output from the pixel region; and a scanning circuit that scans the pixel region so that a partial signal and an added signal are read out, the partial signal being a signal from some of the plurality of photoelectric conversion portions, and the added signal being a signal obtained by adding the signals from the plurality of photoelectric conversion portions.

Further, according to the present invention, provided is an image capturing apparatus comprising: an image sensor, the image sensor including a pixel region having a plurality of microlenses arranged in a matrix and a plurality of photoelectric conversion portions provided for each of the microlenses, a plurality of amplifiers that can amplify signals output from the pixel region using a plurality of different gains including at least a first gain, and a scanning circuit that scans the pixel region so that a partial signal and an added signal are read out, the partial signal being a signal from some of the plurality of photoelectric conversion portions, and the added signal being a signal obtained by adding the signals from the plurality of photoelectric conversion portions; a controller that controls the scanning circuit; a processor that expands a dynamic range using the added signal amplified using the plurality of different gains; and a focus detection circuit that carries out phase difference focus detection using the partial signal and the added signal both of which are amplified using the first gain.

Furthermore, according to the present invention, provided is an image sensor comprising: a pixel region including a plurality of microlenses arranged in a matrix, and a plurality of photoelectric conversion portions provided for each of the microlenses; a plurality of amplifiers that apply a plurality of different gains to signals output from the pixel region; and a scanning circuit that scans the pixel region so that signals are read out in parallel from each of the plurality of photoelectric conversion portions.

Further, according to the present invention, provided is an image capturing apparatus comprising: an image sensor, the image sensor including a pixel region having a plurality of microlenses arranged in a matrix and a plurality of photoelectric conversion portions provided for each of the microlenses, a plurality of amplifiers that amplify signals output from the pixel region using a plurality of different gains including at least a first gain, and a scanning circuit that scans the pixel region so that signals are read out in parallel from each of the plurality of photoelectric conversion portions; a controller that controls the scanning circuit; a processor that expands a dynamic range using an added signal, the added signal obtained by adding signals amplified using the plurality of different gains; and a focus detection circuit that carries out phase difference-type focus detection using signals output from each of the plurality of photoelectric conversion portions, amplified using the first gain.

Further, according to the present invention, provided is an image processing apparatus comprising: a synthesizer that carries out dynamic range expansion synthesis, using a first coefficient, on a plurality of image signals amplified at a plurality of different gains and output from an image sensor, and carries out dynamic range expansion synthesis, using a second coefficient, on a plurality of first signals amplified at the plurality of different gains using pupil-divided partial signals and output from the image sensor; and a processor that finds a second signal by subtracting the synthesized first signals from the synthesized image signals corresponding to the synthesized first signals, wherein the synthesizer determines the second coefficient on the basis of the first coefficient.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 3 is a timing chart illustrating control of the column amplifier when reading out a partial signal for phase difference detection and an image signal for dynamic range expansion, according to embodiments of the present invention.

FIG. 4 is a timing chart illustrating control of the column amplifier when reading out a partial signal for phase difference detection and an image signal when the dynamic range is not expanded, according to embodiments of the present invention.

FIG. 5 is a timing chart illustrating control of the column amplifier when reading out an image signal for dynamic range expansion without reading out a partial signal for phase difference detection, according to embodiments of the present invention.

FIGS. 12A to 12D are diagrams illustrating image data in each of blocks of the image capturing apparatus according to the second embodiment.

FIG. 15 is a block diagram illustrating an overall configuration of an image capturing apparatus according to a fourth embodiment.

FIGS. 24A and 24B are diagrams illustrating a concept of the readout of signals output from an image sensor according to a seventh embodiment.

DESCRIPTION OF THE EMBODIMENTS

Exemplary embodiments of the present invention will be described in detail in accordance with the accompanying drawings. The dimensions, materials, shapes and relative positions of the constituent parts shown in the embodiments should be changed as convenient depending on various conditions and on the structure of the apparatus adapted to the invention, and the invention is not limited to the embodiments described herein.

First Embodiment

Figure 1A:
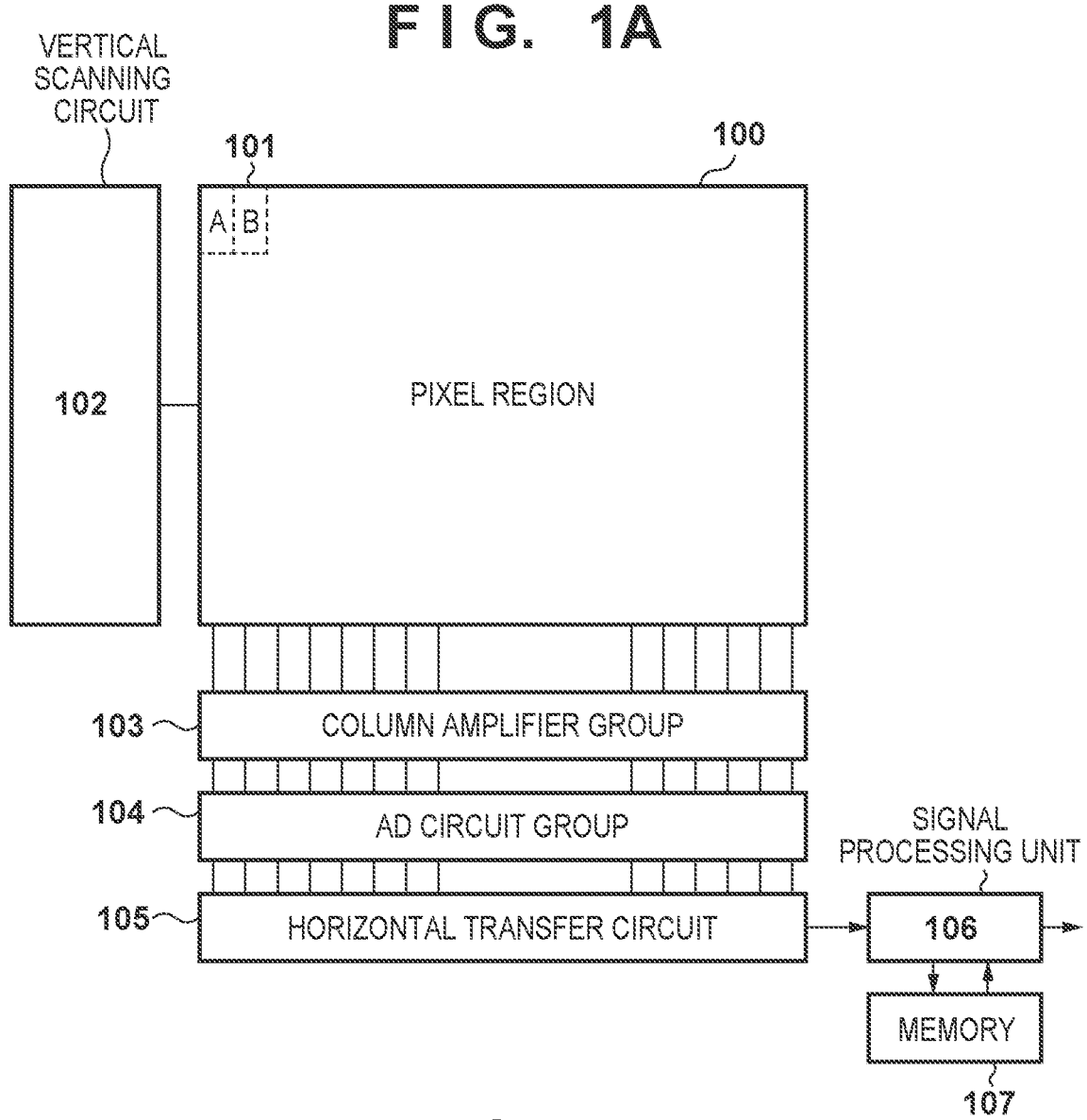
FIGS. 1A and 1B are diagrams schematically illustrating a configuration of an image sensor according to embodiments of the present invention.

FIG. 1A is a diagram illustrating an example of the configuration of an image sensor equipped with an A/D converter according to embodiments of the present invention. A plurality of unit pixels 101, each constituted by photodiodes for photoelectric conversion or the like, are arranged in a matrix in a pixel region 100. Each of the unit pixels 101 is constituted by a photoelectric conversion portion A and a photoelectric conversion portion B for a single microlens 111 (described later) for the purpose of phase difference detection, and focus detection can be carried out by finding a phase difference between image signals obtained from the photoelectric conversion portion A and the photoelectric conversion portion B.

Figure 1B:
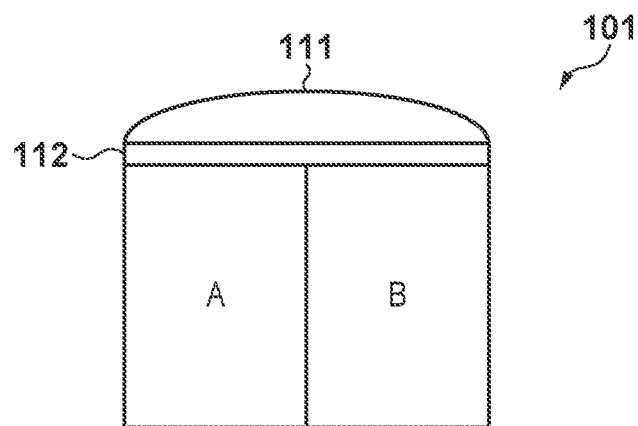

FIG. 1B is a conceptual diagram illustrating a cross-section of the unit pixel 101, where the photoelectric conversion portion A and the photoelectric conversion portion B, each of which includes a photodiode, are provided below the single microlens 111. Each unit pixel 101 includes a color filter 112. Although RGB primary color-type color filters provided in a Bayer pattern, in which one of R (red), G (green), and B (blue) colors corresponds to each pixel, is typically used, the color filters are not necessarily limited thereto.

A vertical scanning circuit 102 controls the timing for sequentially reading out pixel signals, which have been accumulated in the photoelectric conversion portions A and the photoelectric conversion portions B in the pixel region 100, within a single frame period. In a single frame period, the pixel signals are typically read out on a row-by-row basis, in sequence from the top row to the bottom row. In the present embodiment, control is carried out so that the vertical scanning circuit 102 reads out a partial signal (an A signal), which is a signal from the photoelectric conversion portion A, and an added signal (an A+B signal), which is a signal obtained by adding the signals from the photoelectric conversion portion A and the photoelectric conversion portion B, from each unit pixel 101. By reading out the signals in this manner, the A+B signal can be used as-is as an image signal, whereas a B signal can be obtained by subtracting the A signal from the A+B signal and then used in focus detection using an on-imaging plane phase difference detection method. However, it is also possible to read out only the A+B signal if focus detection using the on-imaging plane phase difference detection method is not to performed.

A column amplifier group 103 is constituted by a plurality of column amplifiers, which are provided for each column in the pixel region 100, and is used for electrically amplifying the signals read out from the pixel region 100. Amplifying the signals using the column amplifier group 103 makes it possible to amplify the pixel signal levels with respect to noise arising in an A/D circuit group 104 in a later stage, which substantially improves the SN ratio. Note that the column amplifier group 103 can amplify the signals using multiple gains, and in the present embodiment, the dynamic range is expanded by synthesizing signals amplified at different gains. The configuration of each column amplifier will be described in detail later with reference to FIG. 2B.

The A/D circuit group 104 is constituted by a plurality of circuits, which are provided for each column in the pixel region 100, and converts the signals amplified by the column amplifier group 103 into digital signals. The pixel signals converted into digital signals are read out sequentially by a horizontal transfer circuit 105 and input to a signal processing unit 106. The signal processing unit 106 is a circuit that processes signals digitally, and in addition to carrying out offset correction such as FPN correction in the digital processing, is capable of performing simple gain computations through shift computations and multiplication. The signals are output to the exterior of the image sensor after the processing.

Memory 107 has a function for temporarily holding the A signals, the A+B signals, and the like read out from the pixel region 100 and processed by the column amplifier group 103, the A/D circuit group 104, and the signal processing unit 106.

Figure 2A:
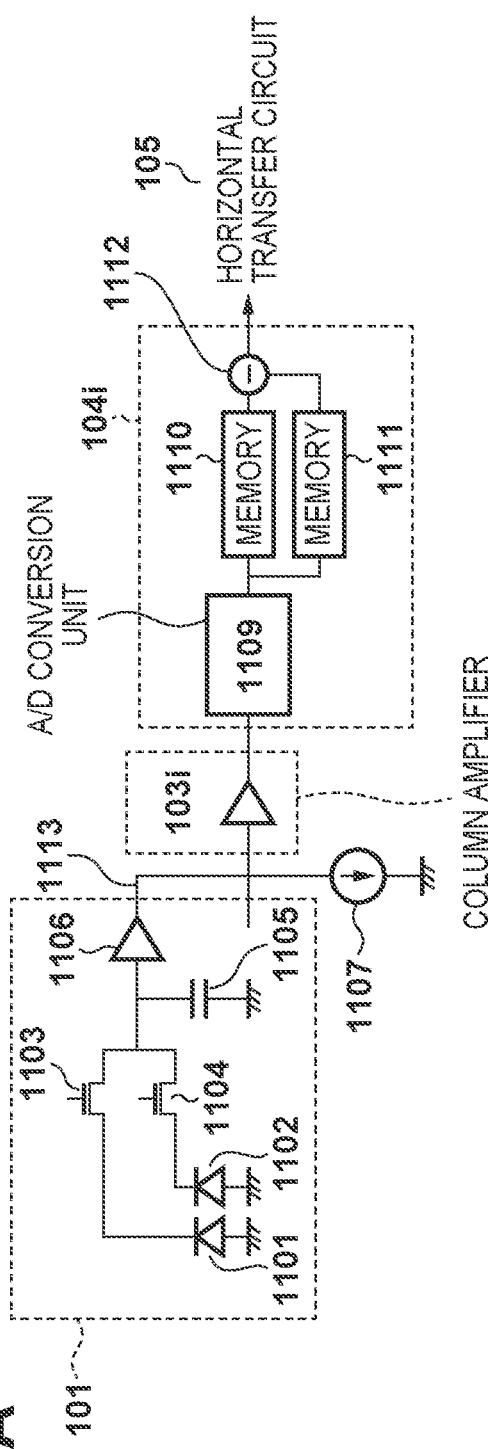
FIG. 2A is a diagram illustrating, in detail, parts of the image sensor, from a unit pixel to an A/D circuit group.

In the example illustrated in FIG. 1B, the configuration is such that the photoelectric conversion portion A and the photoelectric conversion portion B are provided for the single microlens 111 in each unit pixel 101, but the number of photoelectric conversion portions is not limited to two, and may be higher. The pupil division direction may be the horizontal direction or the vertical direction, and may be a combination of these as well. Furthermore, a plurality of pixels may be provided in which the opening positions of the light-receiving portions are different relative to the microlenses 111. In other words, any configuration may be employed in which two signals for phase difference detection, namely the A signal and the B signal, can be obtained. Furthermore, the present invention is not limited to a configuration in which all pixels have a plurality of photoelectric conversion portions, and the configuration may instead be such that a pixel such as that illustrated in FIG. 2A is provided discretely within normal pixels constituting the image sensor. A plurality of types of pixels, which have been divided using mutually-different division methods, may also be included within the same image sensor.

Next, the circuit configuration and the flow of signals from the unit pixel 101 to the A/D circuit group 104 will be described using FIG. 2B. A photoelectric conversion element 1101, which corresponds to the photoelectric conversion portion A in FIG. 1B, and a photoelectric conversion element 1102, which corresponds to the photoelectric conversion portion B in FIG. 1B, share a microlens, and convert light into a charge through photoelectric conversion. A transfer switch 1103 transfers the charge produced by the photoelectric conversion element 1101 to the circuitry in the later stages, and a transfer switch 1104 transfers the charge produced by the photoelectric conversion element 1102 to the circuitry in the later stages. A charge holding unit 1105 temporarily holds the charges transferred from the photoelectric conversion element 1101 and the photoelectric conversion element 1102 when the transfer switches 1103 and 1104 are on. Accordingly, the charge holding unit 1105 is capable of holding the charge from either the photoelectric conversion element 1101 or the photoelectric conversion element 1102, or a charge obtained by adding the charges from the photoelectric conversion element 1101 and the photoelectric conversion element 1102 together. A pixel amplifier 1106 converts the charge held in the charge holding unit 1105 into a voltage signal, and sends that signal to a column amplifier 103*i* in a later stage through a vertical output line 1113. A current control unit 1107 controls current in the vertical output line 1113.

As described above, the column amplifier group 103 illustrated in FIG. 1A is constituted by a plurality of the column amplifiers 103*i*, which are provided for each column, and the column amplifier group 103 amplifies the signals output through the vertical output lines 1113 and outputs the resulting signals to the A/D circuit group 104 in a later stage. Each of A/D circuits 104i, which constitute the A/D circuit group 104, converts analog signals output from the column amplifiers 103i in the same column into digital signals.

In the A/D circuit 104i, a digital signal converted by an A/D conversion unit 1109 is temporarily held in memory 1110 and memory 1111. The memory 1110 holds a pixel signal read out from the photoelectric conversion element 1101 or the photoelectric conversion element 1102, and a noise signal from a readout circuit unit (which, for the sake of simplicity, refers to the circuitry from the charge holding unit 1105 to the A/D conversion unit 1109). On the other hand, the memory 1111 holds the noise signal from the readout circuit unit. A signal obtained by a subtraction unit 1112 subtracting the data held in the memory 1111 from the data held in the memory 1110 is output to the horizontal transfer circuit 105 as a pixel signal.

Figure 2B:
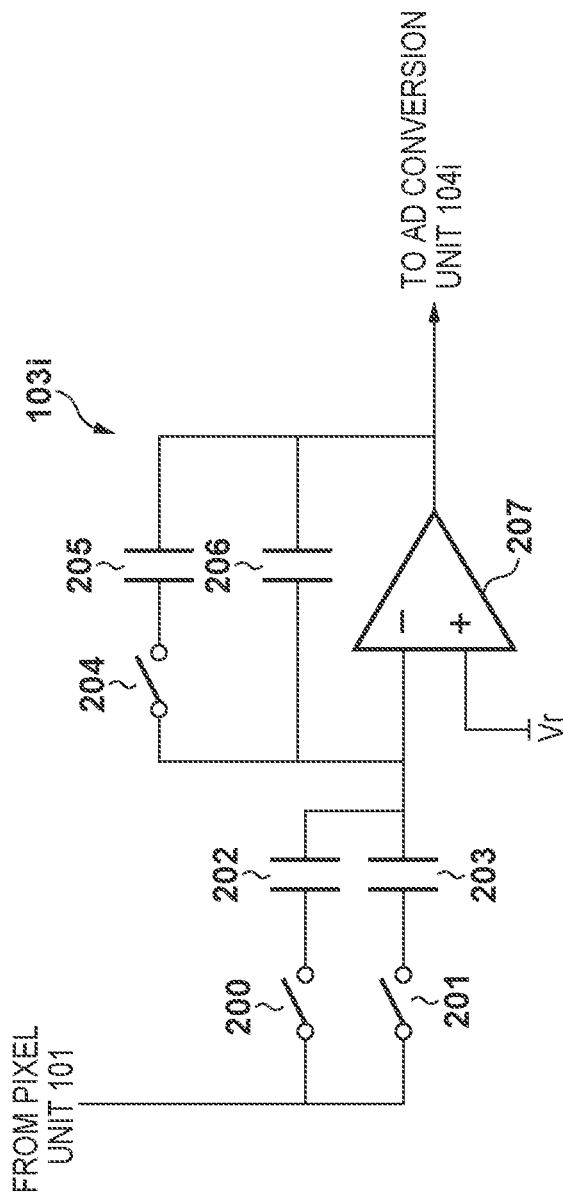
FIG. 2B is a circuit diagram illustrating a configuration of a column amplifier.

FIG. 2B is a diagram illustrating the configuration of the column amplifier 103i. The column amplifier 103i is an inverting amplifier circuit constituted by an op-amp 207, input-side capacitors 202 and 203, and feedback capacitors 205 and 206. The connections of the capacitors 202, 203, and 205 can be switched by switches 200, 201, and 204.

First, a signal input from the unit pixel 101 is accumulated in the capacitors 202 and 203 in response to the switches 200 and 201 turning on. Then, if the signal is an image signal with proper exposure, a high gain is applied to the image signal, after which the image signal is read out, by turning the switches 201 and 204 off and the switch 200 on. Next, when reading out an image signal of a high-luminance portion, a low gain is applied to the image signal, after which the image signal is read out, by turning the switch 200 off and turning the switches 201 and 204 on. In this manner, the image signals can be read out with different gains applied thereto by using the switches to switch the capacitance of the capacitors. The dynamic range is then expanded by synthesizing the image signals read out in this manner.

FIG. 3 is a timing chart illustrating control of the column amplifier 103i when reading out a partial signal for phase difference detection and an image signal for dynamic range expansion.

First, from time t1 to t4, the gain of the column amplifier 103i is set to a high gain by turning the switch 200 on and turning the switches 201 and 204 off. In this state, the transfer switch 1103 is turned on, and the A signal is read out, at time t2. At this time, the A signal read out at a high gain is A/D converted by the A/D circuit 104i during the period from time t2 to t4.

Next, from time t4 to t5, the gain of the column amplifier 103i is set to a low gain by turning the switch 200 off and turning the switches 201 and 204 on. At this time, the A signal read out at a low gain is A/D converted by the A/D circuit 104i during the period from time t4 to t5.

From time t5 to t8, the gain of the column amplifier 103i is again set to a high gain by turning the switch 200 on and turning the switches 201 and 204 off. In this state, the transfer switch 1104 is turned on, and the B signal is read out, at time t6. The A signal and the B signal are added in the charge holding unit 1105 and output as the A+B signal. At this time, the A+B signal read out at a high gain is A/D converted by the A/D circuit 104i during the period from time t6 to t8.

From time t8 to t9, the gain of the column amplifier 103i is set to a low gain by turning the switch 200 off and turning the switches 201 and 204 on. At this time, the A+B signal read out at a low gain is A/D converted by the A/D circuit 104i during the period from time t8 to t9.

FIG. 4 is a timing chart illustrating control of the column amplifier 103i when reading out a partial signal for phase difference detection and an image signal when the dynamic range is not expanded.

In this control, from time t11 to t16, the gain of the column amplifier 103i is set to a high gain by turning the switch 200 on and turning the switches 201 and 204 off. In this state, the transfer switch 1103 is turned on at time t12, and the A signal is read out. At this time, the A signal read out at a high gain is A/D converted by the A/D circuit 104i during the period from time t12 to t14.

Next, the transfer switch 1104 is turned on at time t14, and the B signal is read out. The A signal and the B signal are added in the charge holding unit 1105 and output as the A+B signal. At this time, the A+B signal read out at a high gain is A/D converted by the A/D circuit 104i during the period from time t14 to t16.

FIG. 5 is a timing chart illustrating control of the column amplifier 103i when reading out an image signal for dynamic range expansion without reading out a partial signal for phase difference detection.

In this control, from time t21 to t24, the gain of the column amplifier 103i is set to a high gain by turning the switch 200 on and turning the switches 201 and 204 off. In this state, the transfer switches 1103 and 1104 are turned on at time t22, and the A+B signal is read out. At this time, the A+B signal read out at a high gain is A/D converted by the A/D circuit 104i during the period from time t22 to t24.

Next, from time t24 to t25, the gain of the column amplifier 103i is set to a low gain by turning the switch 200 off and turning the switches 201 and 204 on. At this time, the A+B signal read out at a low gain is A/D converted by the A/D circuit 104i during the period from time t24 to t25.

Figure 6A:
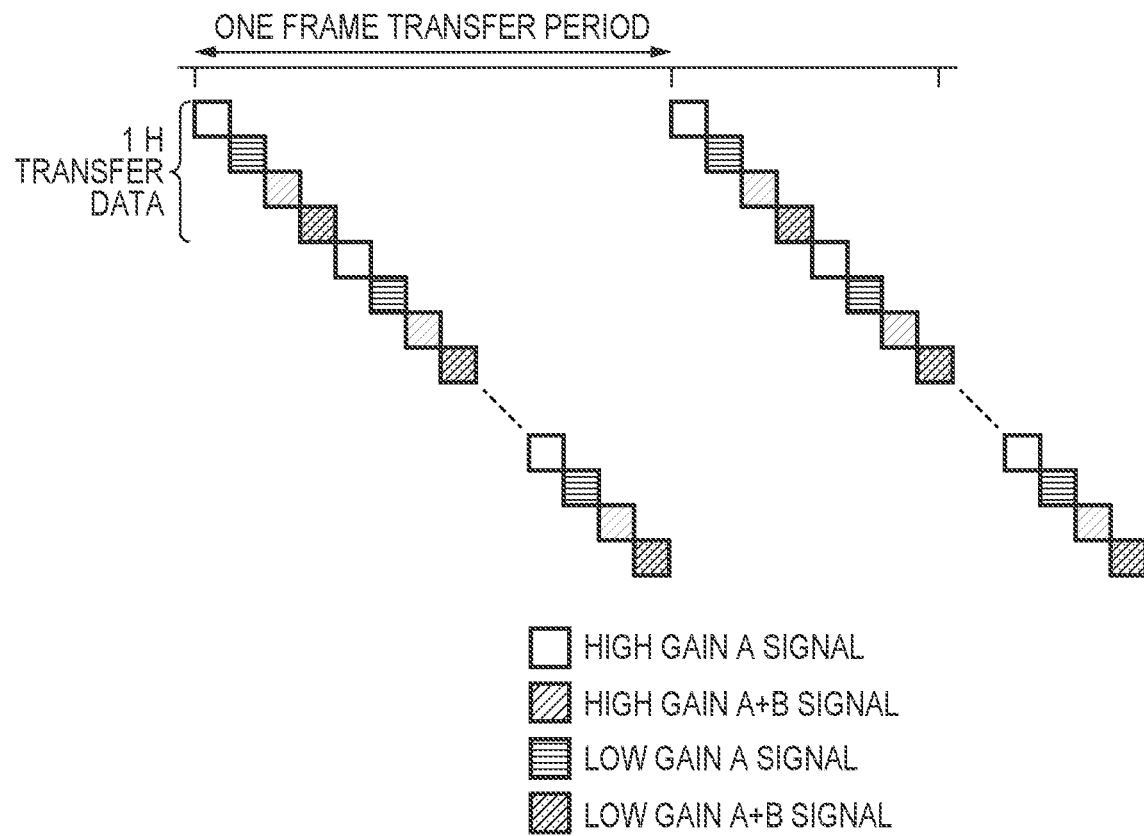
FIGS. 6A and 6B are diagrams illustrating readout timing of image signals from the image sensor according to a first embodiment.
Figure 6B:
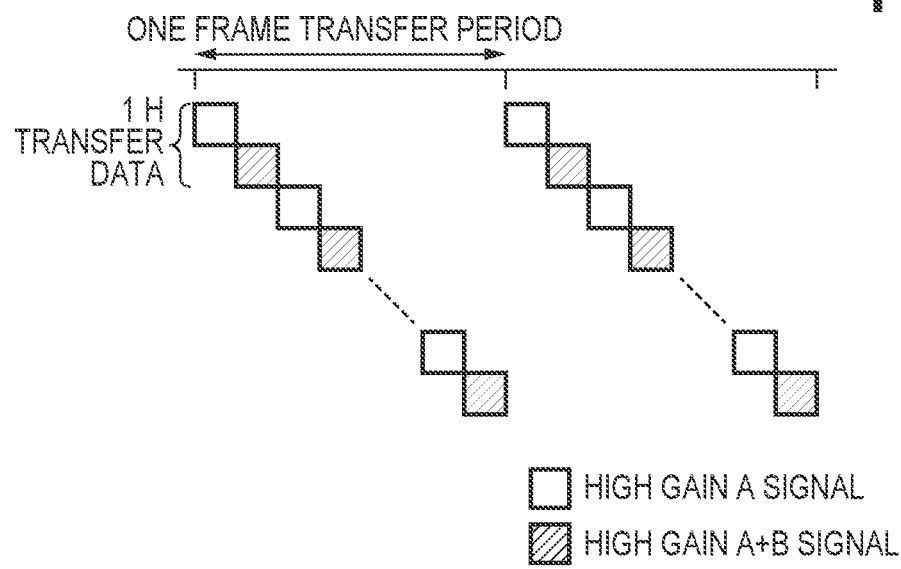

FIGS. 6A and 6B are diagrams illustrating the timings at which image signals are read out from the image sensor according to the first embodiment, and illustrate the concept of the signals read out at each frame as a result of the control illustrated in FIG. 3. In FIGS. 6A and 6B, "1H transfer data" refers to one row's worth of data read out from the pixel region 100.

FIG. 6A is a diagram illustrating the timing of readout when an image signal for phase difference detection, an image signal for phase difference detection when expanding the dynamic range, and the image signal for dynamic range expansion are read out for all rows in a single frame period. Specifically, the A signal is read out at high gain (called a "high gain A signal" hereinafter), and then the A signal is read out at low gain (called a "low gain A signal" hereinafter). Furthermore, the A+B signal is read out at high gain (called a "high gain A+B signal" hereinafter), and then the A+B signal is read out at low gain (called a "low gain A+B signal" hereinafter).

Phase difference detection can be carried out by using the high gain A signal, a high gain B signal obtained by subtracting the high gain A signal from the high gain A+B signal, the low gain A signal, and a low gain B signal obtained by subtracting the low gain A signal from the low gain A+B signal, which have been read out in this manner. The high gain A+B signal and the low gain A+B signal can be used as-is as image signals for dynamic range expansion.

Thus with the configuration of the image sensor according to the present embodiment, the method of readout from the image sensor when reading out one row's worth of data can be changed, and thus an image signal for phase difference detection and an image signal for dynamic range expansion can be read out within the same frame.

However, as illustrated in FIG. 6A, when the image signal for phase difference detection and the image signal for dynamic range expansion are read out in the same frame, the transfer time of the one frame increases. Accordingly, when the focus is to be adjusted quickly without recording, such as when the shutter release is pressed halfway before shooting a still image or when the screen has been zoomed in for adjusting the focus, a phase difference detection mode is activated.

FIG. 6B is a diagram illustrating the readout timing when only the image signal for phase difference detection is read out in the phase difference detection mode, and illustrates the concept of the signals read out in each frame as a result of the control illustrated in FIG. 4. As a result of this control, the high gain A signal and the high gain A+B signal are read out. Thus the information for phase difference detection can be obtained preferentially by increasing the frame rate.

Figure 7A:
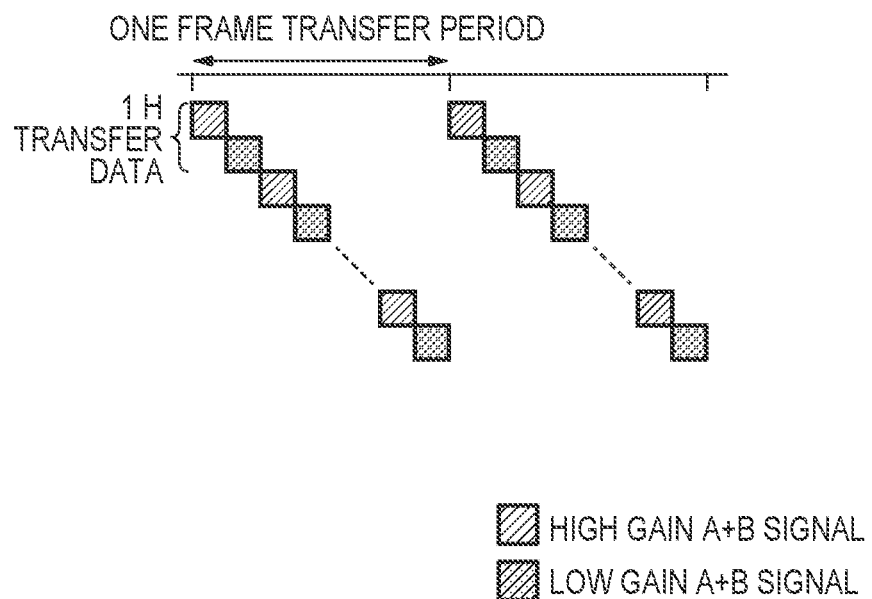
FIGS. 7A and 7B are diagrams illustrating the readout timing of image signals from the image sensor according to the first embodiment.

When the focus is determined in advance and focus information is not needed, such as when shooting a still image, a dynamic range expansion mode is activated. FIG. 7A is a diagram illustrating the readout timing when only the image signal for dynamic range expansion is read out in the dynamic range expansion mode, and illustrates the concept of the signals read out in each frame as a result of the control illustrated in FIG. 5. As a result of this control, the high gain A+B signal and the low gain A+B signal are read out. This makes it possible to shorten the shooting time for a single frame.

Figure 7B:
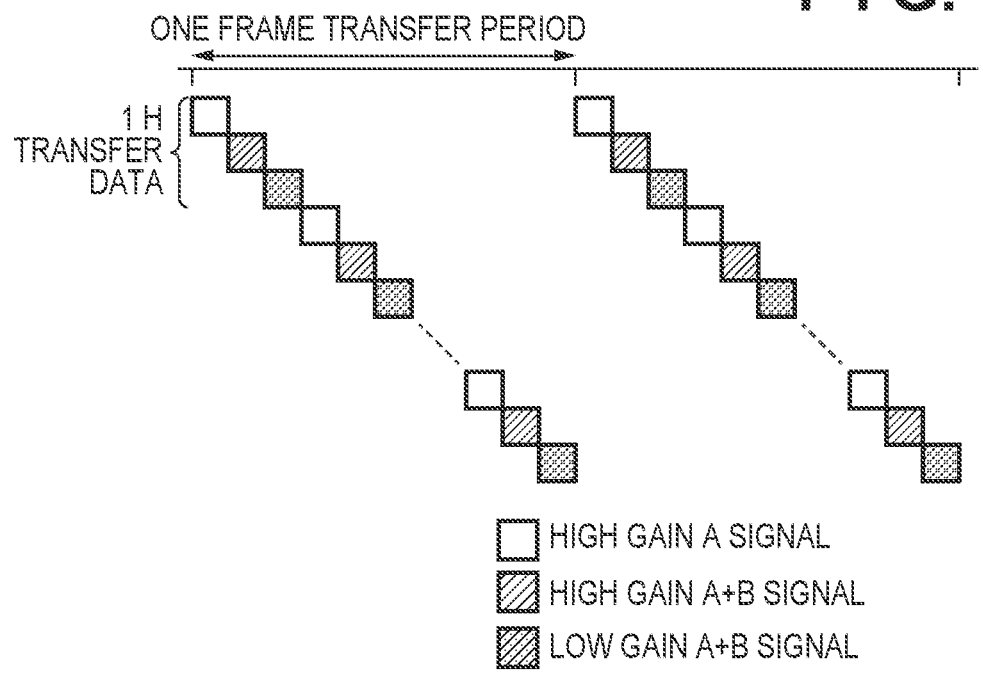

Meanwhile, if phase difference detection is not needed on the high-luminosity side and is only needed near the proper exposure, a method can also be considered in which the A signal read out at low gain to increase the framerate is not output. FIG. 7B is a diagram illustrating the readout timing in such a case, and here, the high gain A signal, the high gain A+B signal, and the low gain A+B signal are read out. By doing so, the image signal for phase difference detection near the proper exposure and the image signal for dynamic range expansion can be obtained.

In addition to the above, the mode may also be changed in accordance with the subject. For example, even if the dynamic range expansion mode illustrated in FIG. 7A is active, the mode may be changed to the phase difference detection mode (FIG. 6B) if the subject to be shot is not a high-luminosity subject, and phase difference detection may be carried out while obtaining the still image.

Furthermore, the order in which the high gain A signal, the low gain A signal, the high gain A+B signal, and the low gain A+B signal are read out is not limited to the example described above. The order can be changed as appropriate, e.g., the order in which the low gain signals and the high gain signals are read out can be reversed, the high gain signals can be read out first and the low gain signals can be read out thereafter, the low gain signals can be read out first and the high gain signals can be read out thereafter, and so on.

Figure 8:
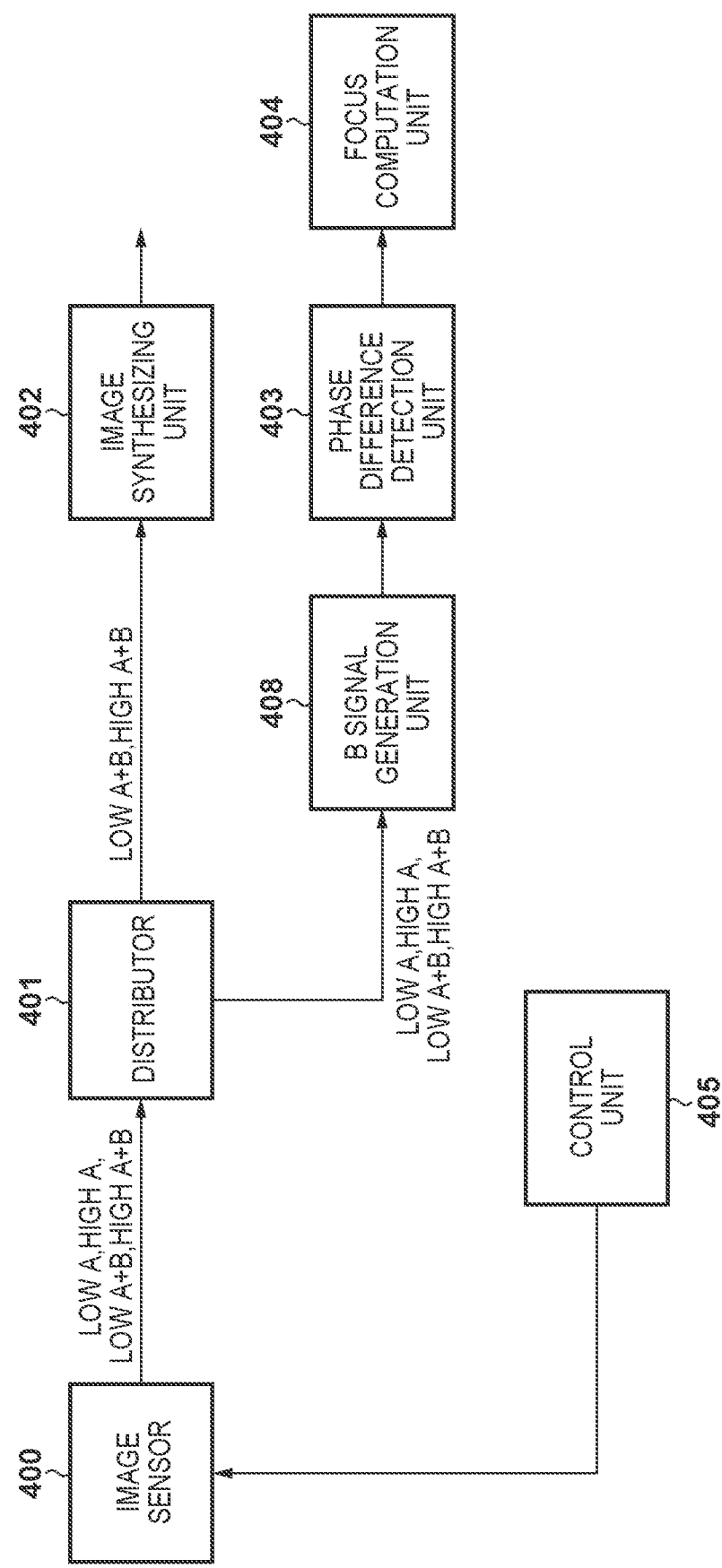
FIG. 8 is a block diagram illustrating an overall configuration of an image capturing apparatus according to the first embodiment.

FIG. 8 is a block diagram illustrating the configuration of an image capturing apparatus according to the present embodiment, and illustrates only constituent elements directly related to the present invention. The flow of signals when an image signal for phase difference detection and an image signal for dynamic range expansion are output from an image sensor 400 from the same frame as illustrated in FIG. 6A will be described hereinafter.

The image sensor 400 is the image sensor illustrated in FIGS. 1A and 1B, and the low gain A signal, the high gain A signal, the low gain A+B signal, and the high gain A+B signal output from the image sensor 400 are input to a distributor 401. The distributor 401 outputs the signals to be used as an image (the low gain A+B signal and the high gain A+B signal) and the signals to be used for phase difference detection (the low gain A signal, the low gain A+B signal, the high gain A signal, and the high gain A+B signal) separately.

A B signal generation unit 408 generates the high gain B signal by subtracting the high gain A signal from the high gain A+B signal output from the distributor 401. The B signal generation unit 408 also generates the low gain B signal by subtracting the low gain A signal from the low gain A+B signal.

A phase difference detection unit 403 detects a phase difference from the signals for phase difference detection output from the B signal generation unit 408 (the high gain A signal, the high gain B signal, the low gain A signal, and the low gain B signal). A focus computation unit 404 carries out focus computation on the basis of the phase difference information detected here and a focus position of a lens. The image capturing apparatus notifies a user of focus information, controls the focus of the lens, and the like on the basis of the obtained focus information.

An image synthesizing unit 402 synthesizes an expanded dynamic range image, using any desired synthesizing method, from the signals for dynamic range expansion output from the image sensor, when the high gain A+B signal is saturated. There is, for example, a method of synthesizing where a high gain image is used for parts where the subject is dark and a low gain image is used for parts where the subject is bright, but the synthesizing algorithm is not limited in the present embodiment as long as the method synthesizes two images having different gains. A control unit 405 controls the switching of shutter speeds, gain, and the like of the image sensor 400, changes the readout driving, and so on.

Although the foregoing example describes the flow of signals when the low gain A signal, the high gain A signal, the low gain A+B signal, and the high gain A+B signal are read out, the signals may instead be read out as described with reference to FIGS. 6B, 7A, and 7B. In that case, the image signals for phase difference detection and the image signals for dynamic range expansion may be output separately to the image synthesizing unit 402 and the phase difference detection unit 403 as necessary by the distributor 401.

Figure 9A:
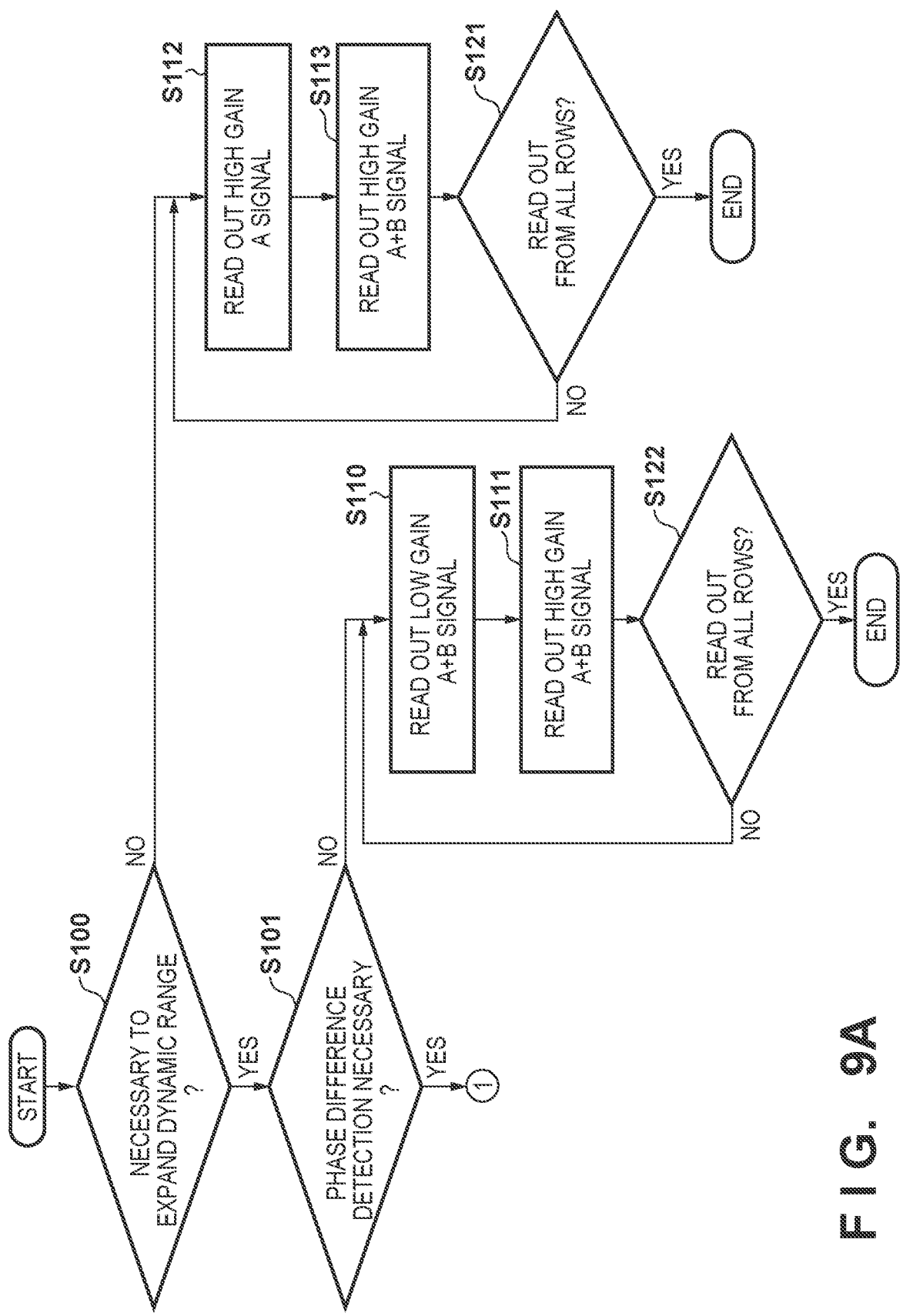
FIGS. 9A and 9B show a flowchart illustrating readout control of the image sensor according to the first embodiment.
Figure 9B:
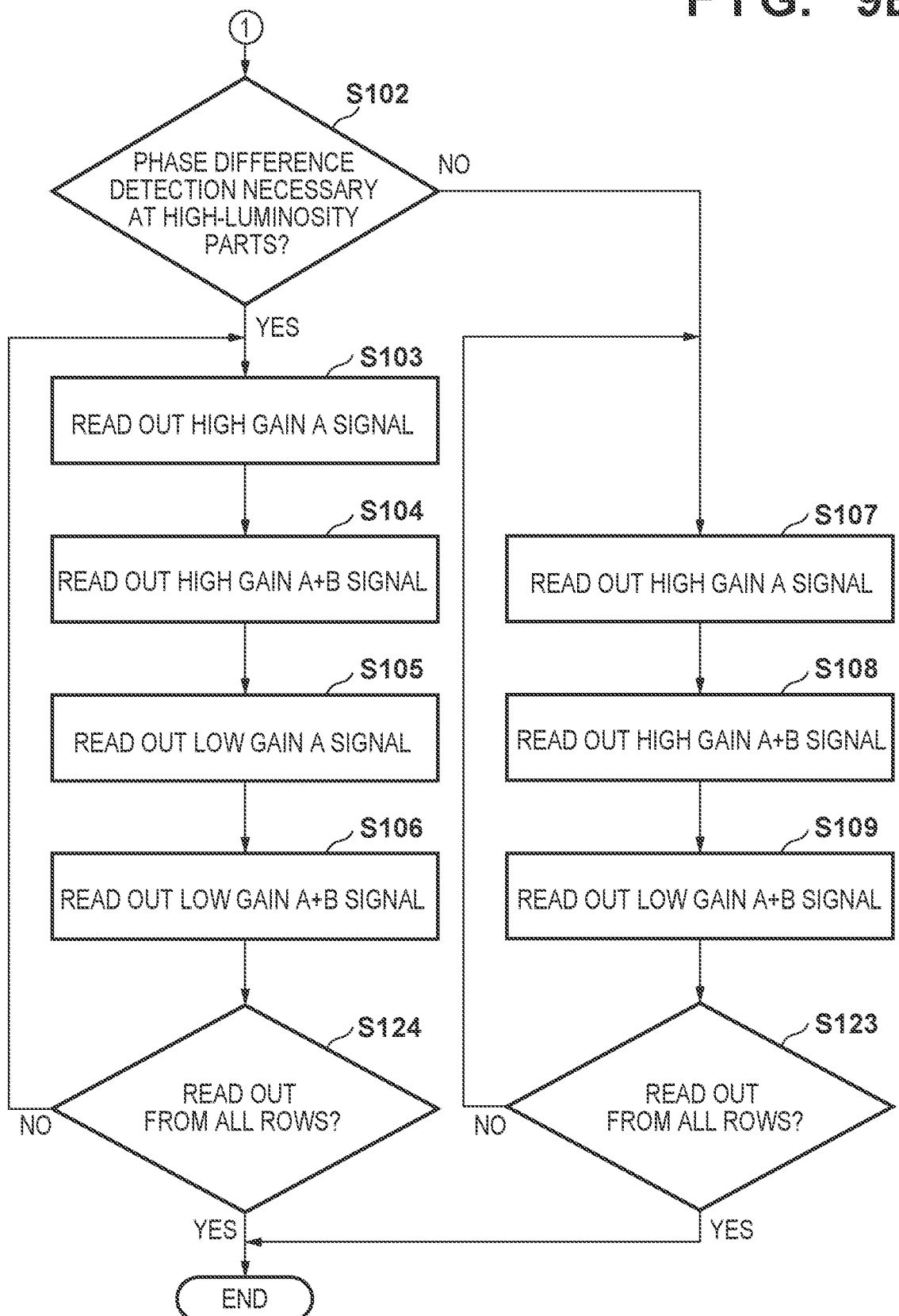

FIGS. 9A and 9B show a flowchart illustrating the readout control of the image sensor 400, carried out by the control unit 405, according to the present first embodiment. First, in step S100, the control unit 405 determines whether or not it is necessary to expand the dynamic range. The determination as to whether or not it is necessary to expand the dynamic range is carried out when the shutter release is pressed halfway before shooting a still image as described above, based on a shooting mode set by the user, or the like, for example. This determination may also be made using the result of determination by the image synthesizing unit 402 whether or not the high gain A+B signal of the image signals in the previous frame is saturated.

If it is not necessary to expand the dynamic range, the process moves to step S112, where the high gain A signal for phase difference detection is read out, after which the process moves to step S113 and the high gain A+B signal is read out. Then, in step S121, it is determined whether or not the readout is complete for all of the rows, and if the readout is not complete, the process returns to step S112 and the readout is continued. This corresponds to the readout order in the phase difference detection mode, illustrated in FIG. 6B.

On the other hand, if it is necessary to expand the dynamic range, the process moves to step S101, where it is determined whether or not phase difference detection is necessary. If it is determined that phase difference detection is not necessary, the process moves to step S110, where the low gain A+B signal is read out, after which the process moves to step S111 and the high gain A+B signal is read out. Then, in step S122, it is determined whether or not the readout is complete for all of the rows, and if the readout is not complete, the process returns to step S110 and the readout is continued. This corresponds to the readout order in the dynamic range expansion mode, illustrated in FIG. 7A.

On the other hand, if phase difference detection is necessary, the process moves to step S102, where it is determined whether or not phase difference detection for high-luminosity parts is necessary. If it is determined that phase difference detection for high-luminosity parts is not necessary, the high gain A signal is read out in step S107, the high gain A+B signal is read out in step S108, and the low gain A+B signal is read out in step S109. Then, in step S123, it is determined whether or not the readout is complete for all of the rows, and if the readout is not complete, the process returns to step S107 and the readout is continued. This corresponds to the readout order illustrated in FIG. 7B.

If phase difference detection for high-luminosity parts is necessary, the process moves to step S103. Then, the high gain A signal is read out in step S103, the high gain A+B signal is read out in step S104, the low gain A signal is read out in step S105, and the low gain A+B signal is read out in step S106. Then, in step S124, it is determined whether or not the readout is complete for all of the rows, and if the readout is not complete, the process returns to step S103 and the readout is continued. This corresponds to the readout order illustrated in FIG. 6A.

The process of FIGS. 9A and 9B ends when one frame's worth of readout ends through any of the above-described readout methods.

According to the present embodiment as described thus far, an image signal used for dynamic range expansion and an image signal used for phase difference detection can be obtained in each frame. Additionally, carrying out control so that unnecessary image signals are not read out makes it possible to increase the frame rate as compared to a case where the image signal used for dynamic range expansion and the image signal used for phase difference detection are all read out from every row.

Second Embodiment

A second embodiment of the present invention will be described next. Note that the image sensor according to the second embodiment is the same as that described in the first embodiment, and thus descriptions thereof will be omitted here.

Figure 10A:
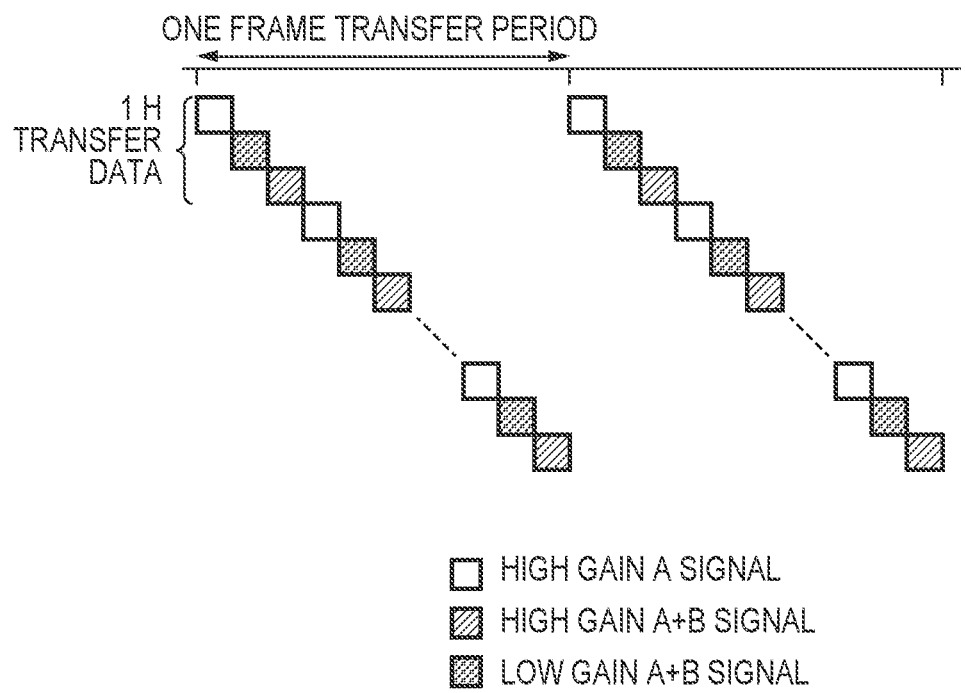
FIGS. 10A and 10B are diagrams illustrating readout timing of image signals from the image sensor according to a second embodiment.
Figure 10B:
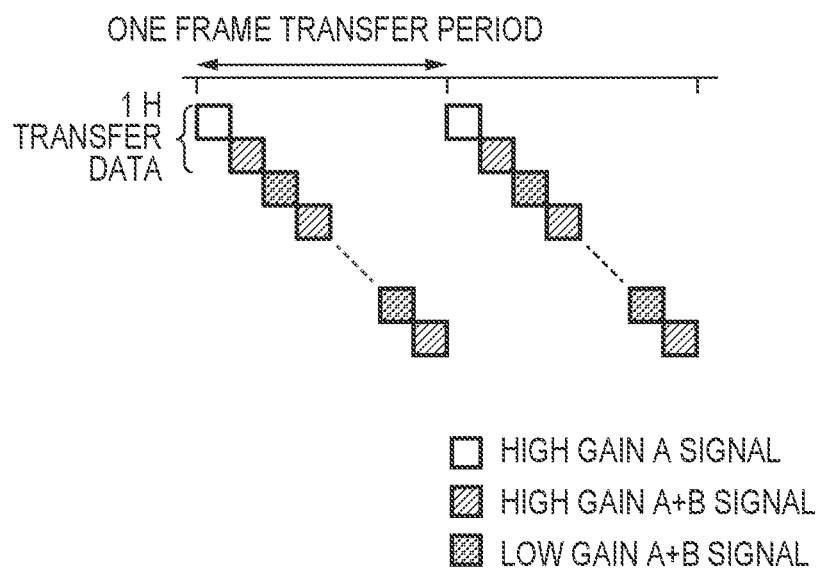

FIGS. 10A and 10B are diagrams illustrating the readout timing of image signals from the image sensor according to the second embodiment. As in FIGS. 6A and 6B, "1H transfer data" refers to one row's worth of data read out from the pixel region 100.

FIG. 10A illustrates the readout timing when the image signal for phase difference detection and the image signal for dynamic range expansion are read out for all lines within a single frame period, without carrying out phase difference detection on the high-luminosity side, and corresponds to the readout method illustrated in FIG. 7B.

If image signals for phase difference detection and for dynamic range expansion are read out in addition to the normal image signals for all lines in this manner, the data amount will be three times the data amount resulting from normal readout in which dynamic range expansion and phase difference detection are not carried out, which takes up a large amount of bandwidth. The framerate will therefore be slower than when reading out only the normal image signal.

Accordingly, in the present embodiment, the image signal for phase difference detection and the image signal for dynamic range expansion are output in an alternating manner, from row to row, to increase the framerate, as illustrated in FIG. 10B. Thus the frame rate can be increased by reducing the data amount of the image signals in a single frame. Furthermore, phase difference detection can be carried out for the entire area within the screen if the readout method illustrated in FIG. 10B is used, and thus accurate focus control is possible even when the user wishes to focus on a desired location.

Figure 11:
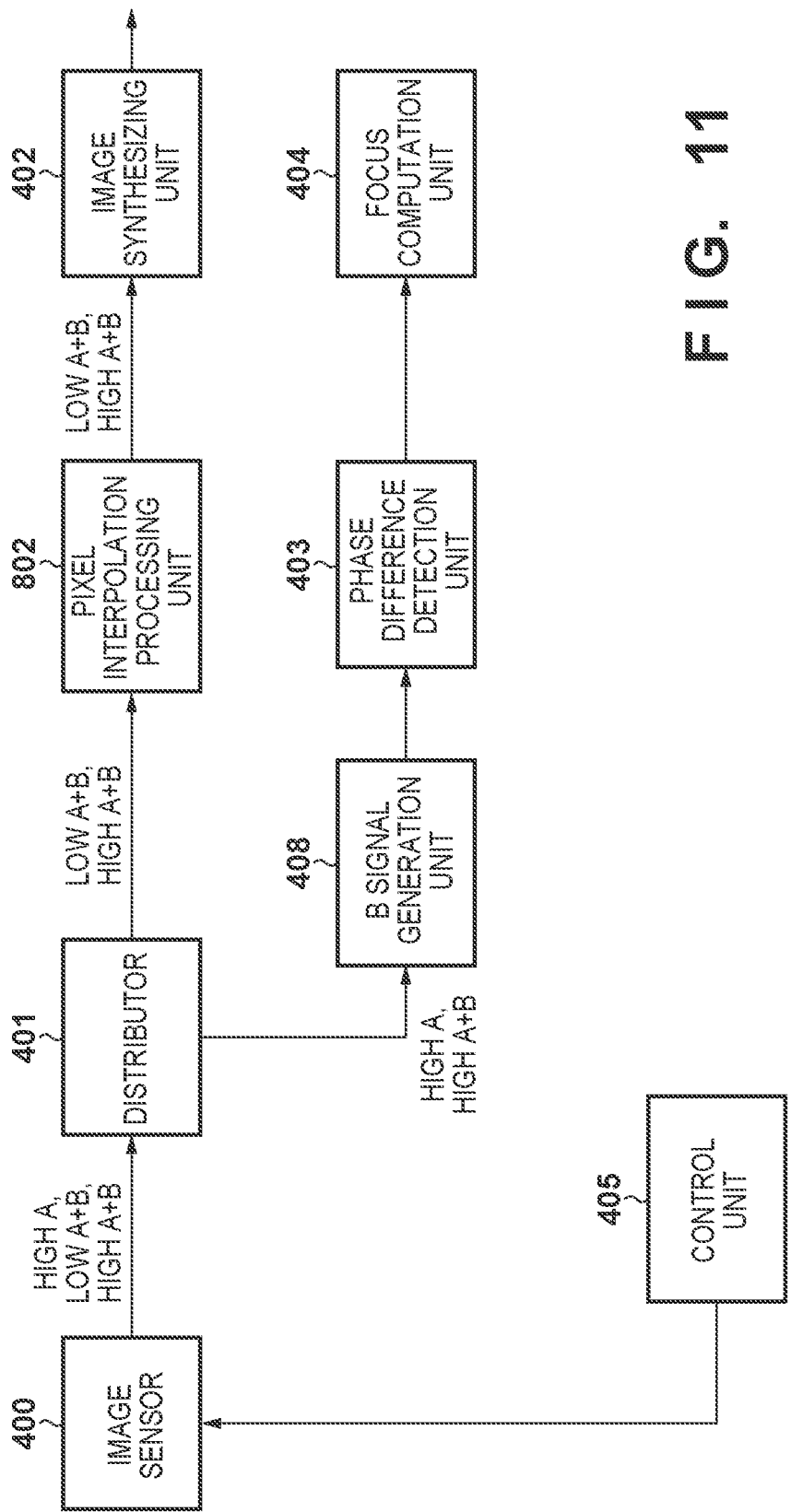
FIG. 11 is a block diagram illustrating an overall configuration of an image capturing apparatus according to the second embodiment.

FIG. 11 is a block diagram illustrating the overall configuration of an image capturing apparatus according to the second embodiment. The image capturing apparatus according to the second embodiment adds a pixel interpolation processing unit 802 to the configuration described in the first embodiment with reference to FIG. 8. The rest of the configuration is the same as that illustrated in FIG. 8, and thus the same reference signs are used, with descriptions omitted as appropriate.

Processing carried out when reading out the image signal for phase difference detection and the image signal for dynamic range expansion in an alternating manner, from row to row, from the image sensor 400 as illustrated in FIG. 10B will be described next.

The high gain A signal read out at a high gain, the A+B signal read out at a high gain, and the A+B signal read out at a low gain, which have been output from the image sensor 400, are input to the distributor 401. The distributor 401 outputs the signals used as an image (the low gain A+B signal and the high gain A+B signal) and the signals used for phase difference detection (the high gain A signal and the high gain A+B signal) separately.

The B signal generation unit 408 generates the high gain B signal by subtracting the high gain A signal from the high gain A+B signal output from the distributor 401. The phase difference detection unit 403 detects a phase difference between the signals for phase difference detection output from the B signal generation unit 408 (the high gain A signal and the high gain B signal). The focus computation unit 404 carries out focus computation on the basis of the phase difference information detected here and the focus position of a lens. The image capturing apparatus notifies a user of focus information, controls the focus of the lens, and the like on the basis of the obtained focus information.

On the other hand, for lines from which the low gain A+B signal is not read out, the pixel interpolation processing unit 802 interpolates the pixel signals from the lines thereabove and therebelow (described later). The image synthesizing unit 402 synthesizes an expanded dynamic range image, using any desired synthesizing method, from the high gain A+B signal and the low gain A+B signal, when the high gain A+B signal is saturated.

Here, FIGS. 12A to 12D illustrate the image data at each of the blocks illustrated in FIG. 11. FIG. 12A illustrates the image signals output from the image sensor 400. As illustrated in FIG. 12A, in the image signals output from the image sensor 400, the high gain A signal and the low gain A+B signal are read out in an alternating manner between the high gain A+B signals.

FIG. 12B illustrates the image signals separated by the distributor 401 and input to the pixel interpolation processing unit 802. The high gain A signal used for phase difference detection is not necessary for expanding the dynamic range and is therefore thinned out by the distributor 401, and thus the lines in which the high gain A signal for phase difference detection is read out lack the low gain A+B signal for dynamic range expansion.

FIG. 12C is a diagram illustrating the image signals output from the pixel interpolation processing unit 802. In the lines where the high gain A signal is read out, the low gain A+B signal is interpolated using the low gain A+B signals that are adjacent above and below.

Finally, FIG. 12D is a diagram illustrating the image signals input to the B signal generation unit 408. Because the signals for dynamic range expansion are not needed in the phase difference detection process, the low gain A+B signal and the high gain A+B signal, which are image signals for dynamic range expansion in the lines where the high gain A signal is not read out, are thinned out by the distributor 401.

According to the present second embodiment as described thus far, dynamic range expansion and phase difference detection can be carried out throughout the entire pixel region even when fewer image signals are read out.

Third Embodiment

A third embodiment of the present invention will be described next. Note that the image sensor according to the third embodiment is also the same as that described in the first embodiment, and thus descriptions thereof will be omitted here.

In the above-described second embodiment, an image signal for dynamic range expansion is generated through interpolation using the low gain A+B signals adjacent above and below for lines in which the high gain A signal for phase difference detection is read out. However, interpolating the image signal from above and below reduces the vertical resolution. Accordingly, in the present embodiment, the luminance level of the image signal for phase difference detection is detected, and when the luminance level is less than or equal to a prescribed value and the phase difference is less than or equal to a prescribed value, the image signal for phase difference detection, rather than the interpolated low gain A+B signal, is used as the image signal for dynamic range expansion, which prevents a drop in the vertical resolution.

Figure 13:
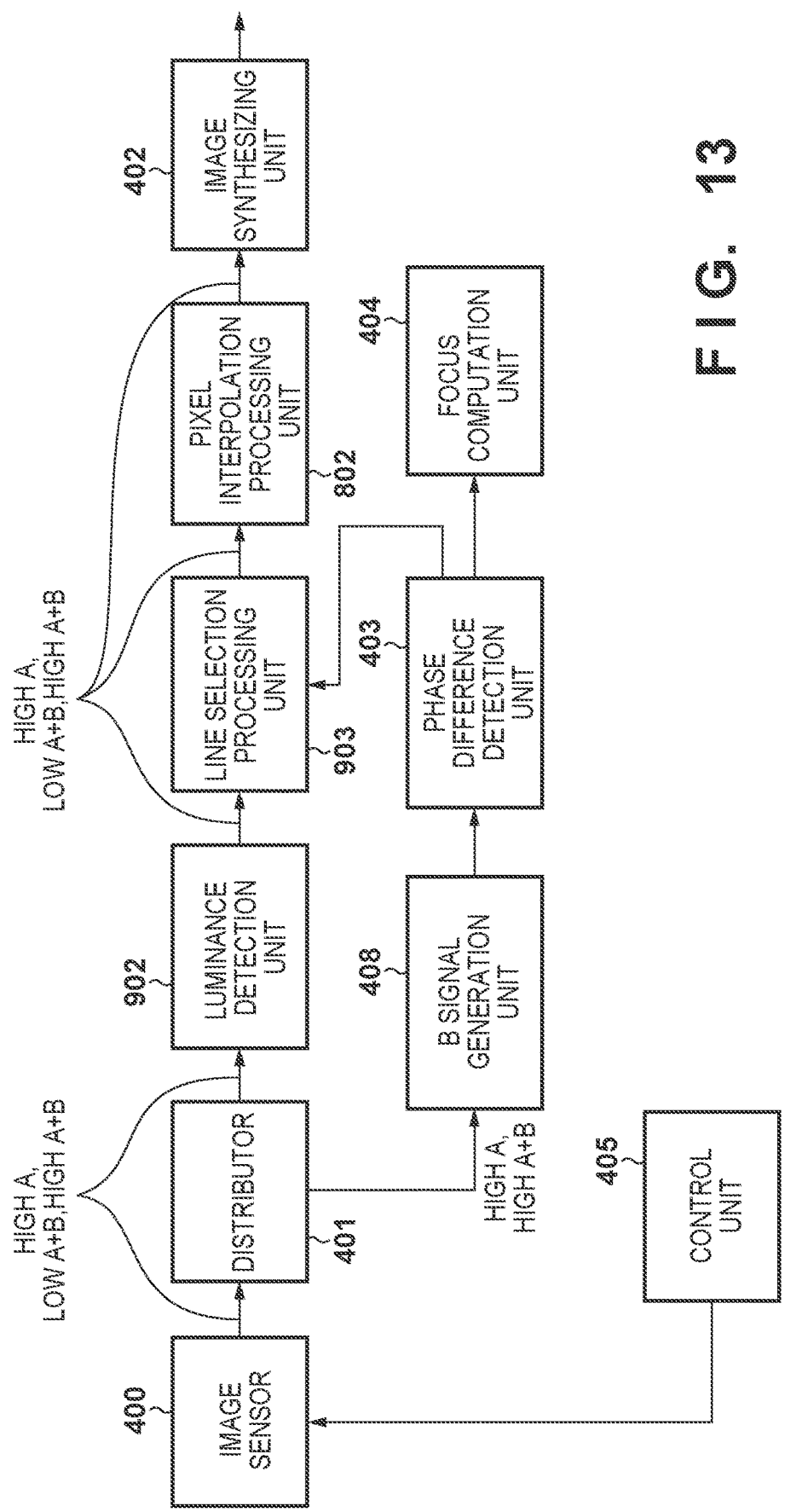
FIG. 13 is a block diagram illustrating an overall configuration of an image capturing apparatus according to a third embodiment.

FIG. 13 is a block diagram illustrating the overall configuration of an image capturing apparatus according to the third embodiment. The image capturing apparatus according to the present embodiment adds a luminance detection unit 902 and a line selection processing unit 903 to the configuration described in the second embodiment with reference to FIG. 11. The processing by the distributor 401 also differs from that illustrated in FIG. 11. The rest of the configuration is the same as that described in the first embodiment with reference to FIG. 8 and in the second embodiment with reference to FIG. 11, and thus the same reference signs are used, with descriptions omitted as appropriate.

In the third embodiment, the distributor 401 outputs three signals, namely the high gain A signal, the low gain A+B signal, and the high gain A+B signal, as signals used for images. The signals output from the distributor 401 are input to the luminance detection unit 902. The luminance detection unit 902 detects the luminance of the high gain A signal and outputs the detection result to the line selection processing unit 903. The line selection processing unit 903 determines whether or not to use the high gain A signal as the image signal for dynamic range expansion on the basis of the information from the luminance detection unit 902 and the phase difference detection unit 403.

Figure 14:
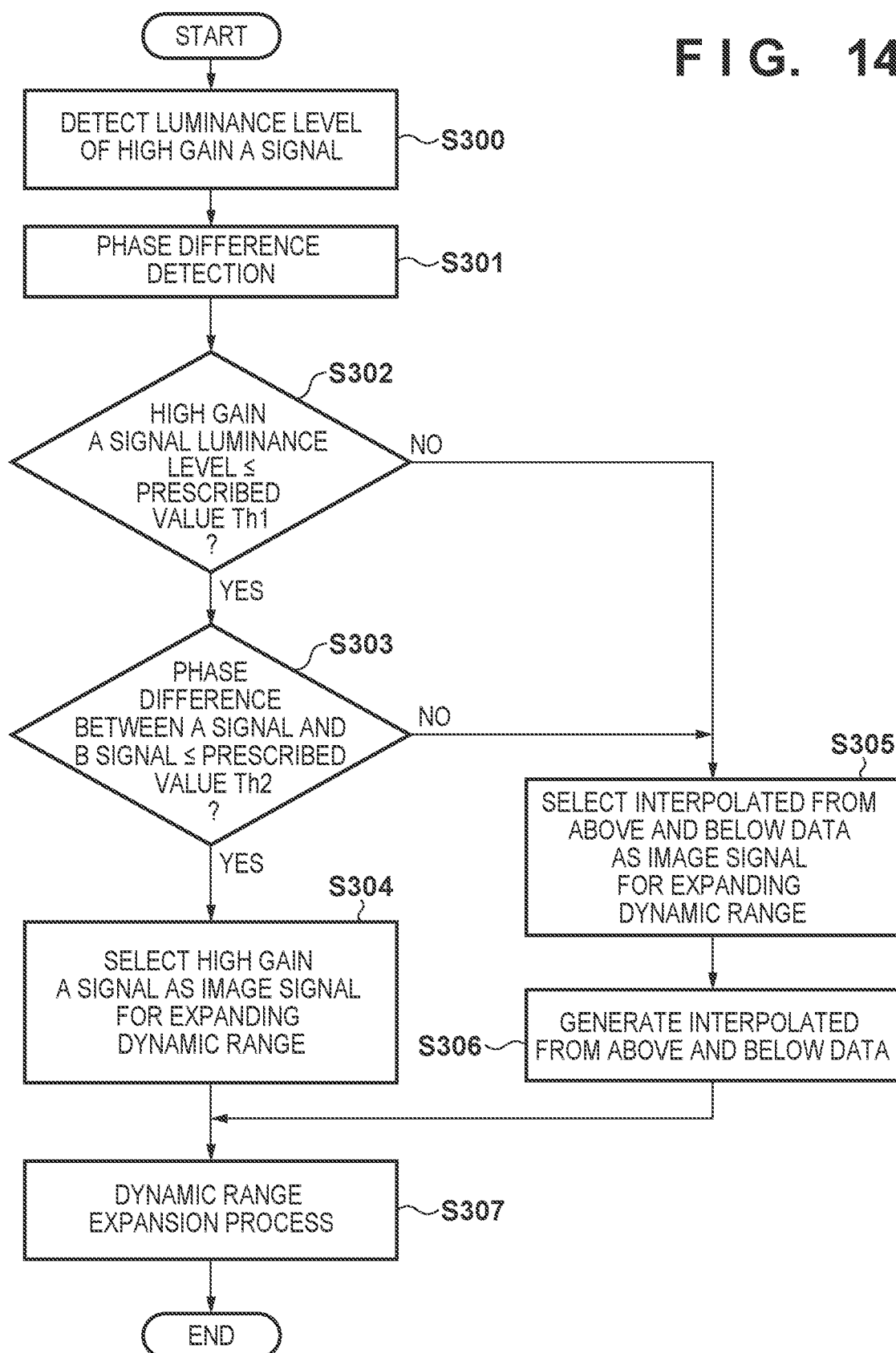
FIG. 14 is a flowchart illustrating processing according to the third embodiment.

FIG. 14 is a flowchart illustrating processing performed in the third embodiment. First, in step S300, the luminance detection unit 902 detects the luminance level of the high gain A signal of the input line. Then, in step S301, the phase difference detection unit 403 detects a phase difference between the high gain A signal and the high gain B signal.

In step S302, the line selection processing unit 903 determines whether or not the luminance level of the high gain A signal detected in step S300 is less than or equal to a prescribed value Th1 (less than or equal to a threshold). The process moves to step S303 if the level is less than or equal to the prescribed value Th1, and to step S305 if the level is greater than the prescribed value Th1.

In step S303, it is determined whether or not the phase difference between the high gain A signal and the high gain B signal is less than or equal to a prescribed value Th2 on the basis of the detection result from step S301. If the difference is less than or equal to the prescribed value Th2, it is determined that the focus state is near an in-focus state, and the process moves to step S304, whereas if the difference is greater than the prescribed value Th2, the process moves to step S305.

In step S304, the high gain A signal is selected as the image signal for dynamic range expansion. On the other hand, in step S305, the low gain A+B signal interpolated from above and below is selected to be used as the image signal for dynamic range expansion, and the pixel interpolation processing unit 802 generates data interpolated from above and below in step S306. In step S307, the image synthesizing unit 402 carries out a process for expanding the dynamic range using the high gain A signal or the low gain A+B signal.

According to the third embodiment as described above, the dynamic range can be expanded without reducing the resolution in the vertical direction by using the high gain A signal when the luminance level of the high gain A signal is less than or equal to a predetermined luminance and the focus state is in focus or near an in-focus state.

Fourth Embodiment

A fourth embodiment of the present invention will be described next. Note that the image sensor according to the fourth embodiment is also the same as that described in the first embodiment, and thus descriptions thereof will be omitted here.

The fourth embodiment adds, to the third embodiment, a process for detecting a movement amount in an object when shooting a moving image, changing the driving of the image sensor if the movement amount is less than or equal to a prescribed movement amount, and switching between readout for phase difference detection and readout for dynamic range expansion from frame to frame. A drop in the vertical resolution is prevented by using the image signals from the previous and next frames during image synthesizing.

FIG. 15 is a block diagram illustrating the overall configuration of an image capturing apparatus according to the fourth embodiment. The configuration illustrated in FIG. 15 adds a motion vector detection unit 909 and memory 910 to the configuration described in the third embodiment with reference to FIG. 13. The rest of the configuration is the same as that illustrated in FIG. 13, and thus the same reference signs are used, with descriptions omitted as appropriate.

The motion vector detection unit 909 detects the movement amount of an object and outputs the detection result to the image synthesizing unit 402 and the control unit 405. The memory 910 can temporarily hold image signals, and an image can be synthesized using the image signals from the previous and next frames.

Figure 16:
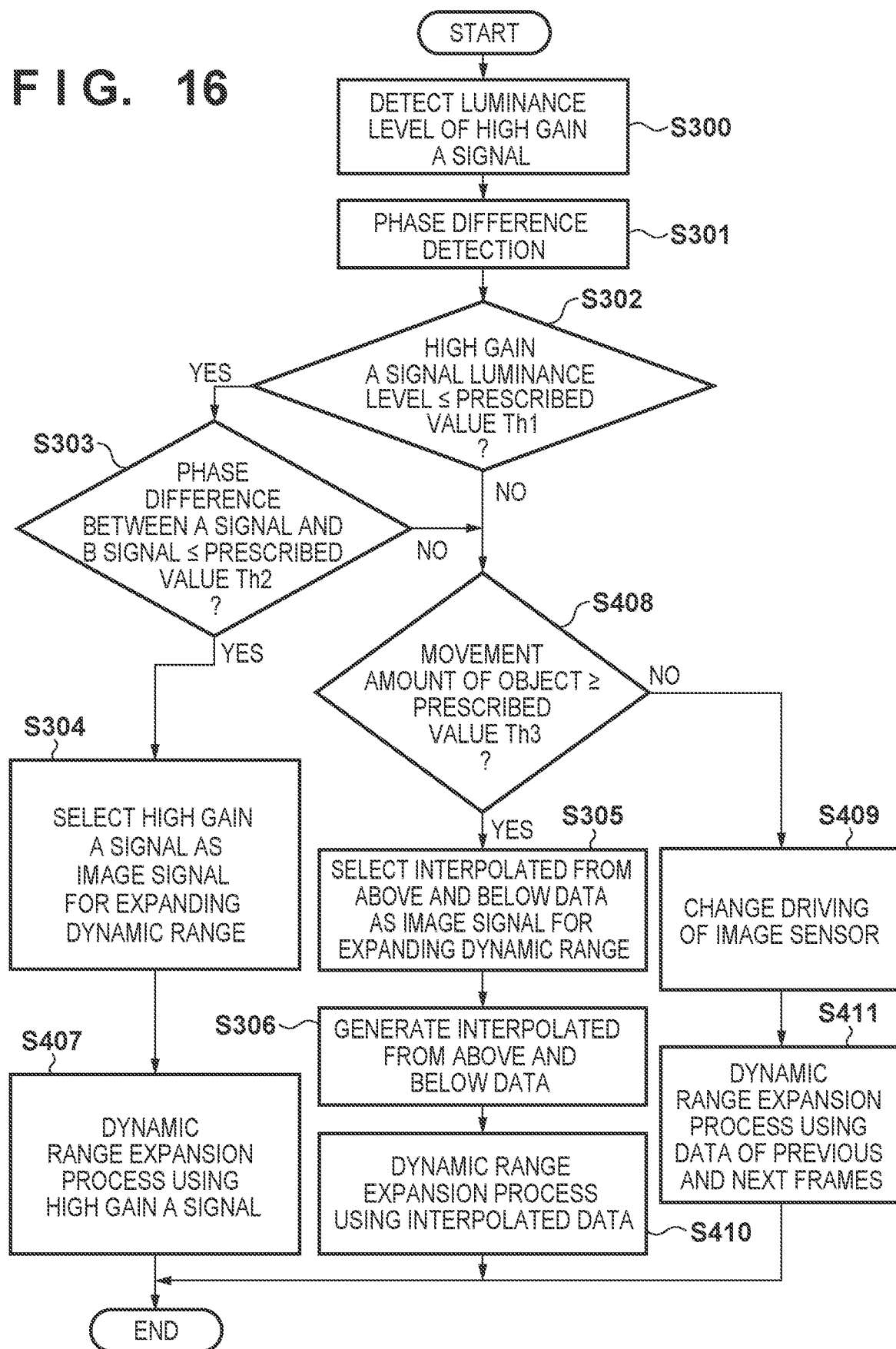
FIG. 16 is a flowchart illustrating processing according to the fourth embodiment.

FIG. 16 is a flowchart illustrating processing performed in the fourth embodiment. Processes that are the same as the processes described in the third embodiment with reference to FIG. 14 are given the same step numbers, with descriptions omitted as appropriate.

When, in step S304, the high gain A signal is selected as the image signal for dynamic range expansion, in step S407, the image synthesizing unit 402 carries out a process for expanding the dynamic range by using the high gain A signal, as described in the third embodiment.

On the other hand, if the high gain A signal is not selected, the process moves from step S303 to step S408, and in step S408, it is determined whether or not the movement amount of the object is greater than or equal to a prescribed value Th3. If the amount is greater than or equal to the prescribed value Th3, the process moves to step S305, where the data, interpolated from the low gain A+B signals in the pixels above and below, is selected. In step S306, the pixel interpolation processing unit 802 generates the interpolated data, and in step S410, the image synthesizing unit 402 carries out a process for expanding the dynamic range using the low gain A+B signal.

On the other hand, if the movement amount of the object is less than the prescribed value Th3, in step S409, the driving of the image sensor 400 is changed. Here, a process for alternating between reading out the high gain A signal and the high gain A+B signal (the readout method illustrated in FIG. 6B) and reading out the high gain A+B signal and the low gain A+B signal (the readout method illustrated in FIG. 7A) from frame to frame is carried out. Then, in step S411, a process for expanding the dynamic range using the signal interpolated from the low gain A+B signal of the previous and next frames, held in the memory 910, is carried out.

According to the fourth embodiment as described thus far, a process for expanding the dynamic range using a signal interpolated from the low gain A+B signals in the previous and next frames is carried out when there is little movement in an object, which makes it possible to suppress a drop in the vertical resolution.

Fifth Embodiment

A fifth embodiment of the present invention will be described next. Note that the image sensor according to the fifth embodiment is the same as that described in the first embodiment, and thus descriptions thereof will be omitted here.

Figure 17:
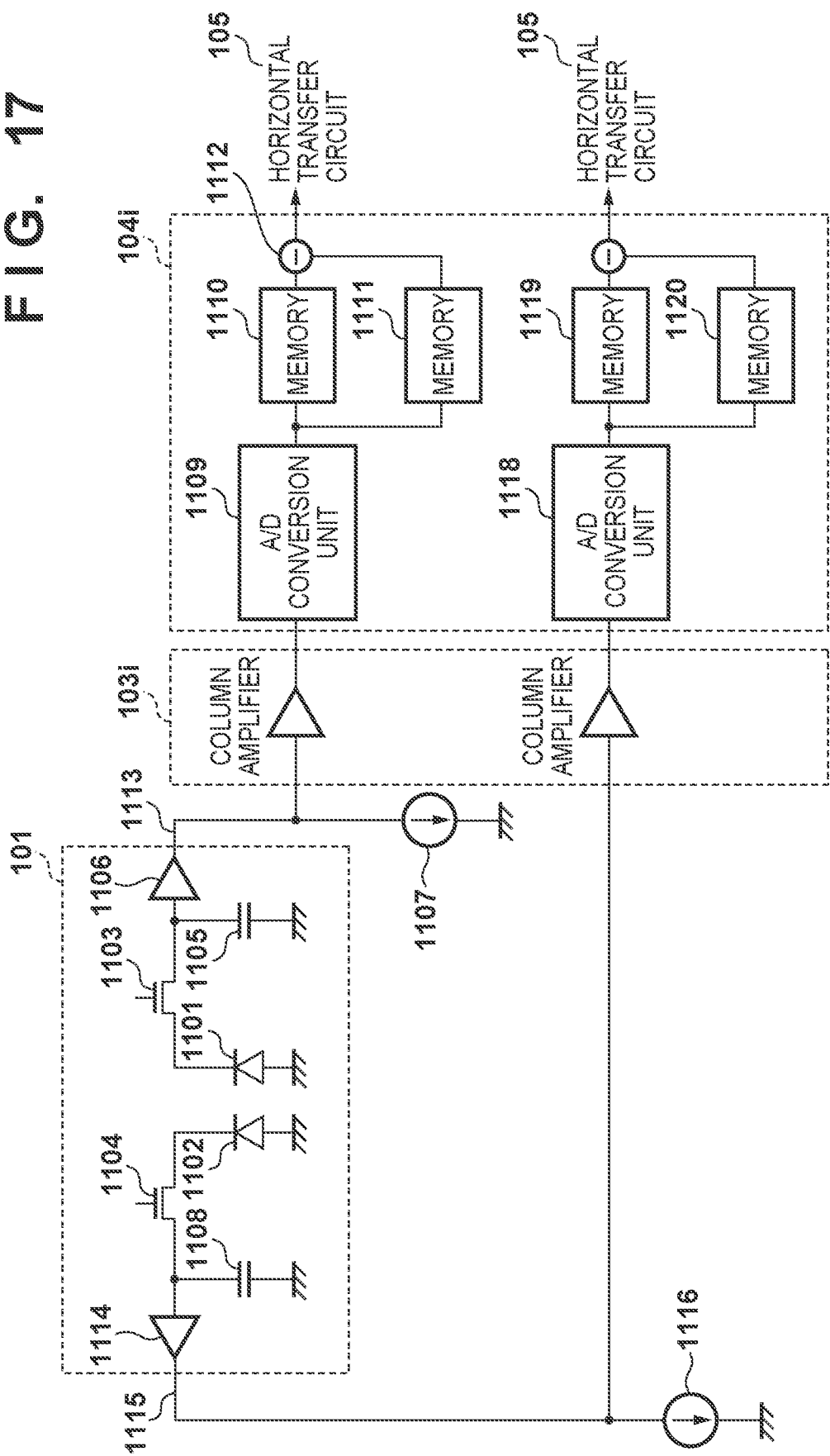
FIG. 17 is a diagram illustrating, in detail, parts of the image sensor, from a unit pixel to an A/D circuit group, according to a fifth embodiment.

FIG. 17 is a diagram illustrating details from the unit pixel 101 to the A/D circuit group 104 in the image sensor, in which vertical output lines, column amplifiers, and the like are connected to both the photoelectric conversion portions A and B. In this configuration, the signals from the photoelectric conversion element 1101 corresponding to the photoelectric conversion portion A and the photoelectric conversion element 1102 corresponding to the photoelectric conversion portion B, illustrated in FIG. 1B, can be read out in parallel to the vertical output line 1113 and a vertical output line 1115, respectively.

In FIG. 17, elements that are the same as those illustrated in FIG. 2A are given the same reference signs, and descriptions thereof are omitted. The configuration illustrated in FIG. 17 adds, to the configuration illustrated in FIG. 2A, a charge holding unit 1108 and a pixel amplifier 1114 for reading out the partial signals from the photoelectric conversion element 1102 independently, and a current control unit 1116 for controlling current in the vertical output line 1115, in each of the pixels 101.

The column amplifier 103$i$ includes two amplifiers for amplifying the signals output from the photoelectric conversion element 1101 and the photoelectric conversion element 1102 to the vertical output lines 1113 and 1115, respectively, and outputs the amplified signals to the A/D circuit group 104 in a later stage. Additionally, in addition to the configuration illustrated in FIG. 2A, each A/D circuit 104$i$ includes an A/D conversion unit 1118 for converting an analog signal from the photoelectric conversion element 1102 into a digital signal, and memory 1119 and memory 1120 for temporarily holding the digital signal.

According to this configuration, the partial signals from the photoelectric conversion elements 1101 and 1102 can be read out, processed, and output in parallel, which, although increasing the circuit scale, also makes it possible to shorten the readout time.

Additionally, the A+B signal can be obtained by adding the read out A signal and the B signal in the signal processing unit 106. However, in this case, the B signal generation unit 408 illustrated in FIGS. 8, 11, and 13 is not necessary, whereas an A+B signal generation unit is necessary between the distributor 401 and the image synthesizing unit 402.

Figure 18:
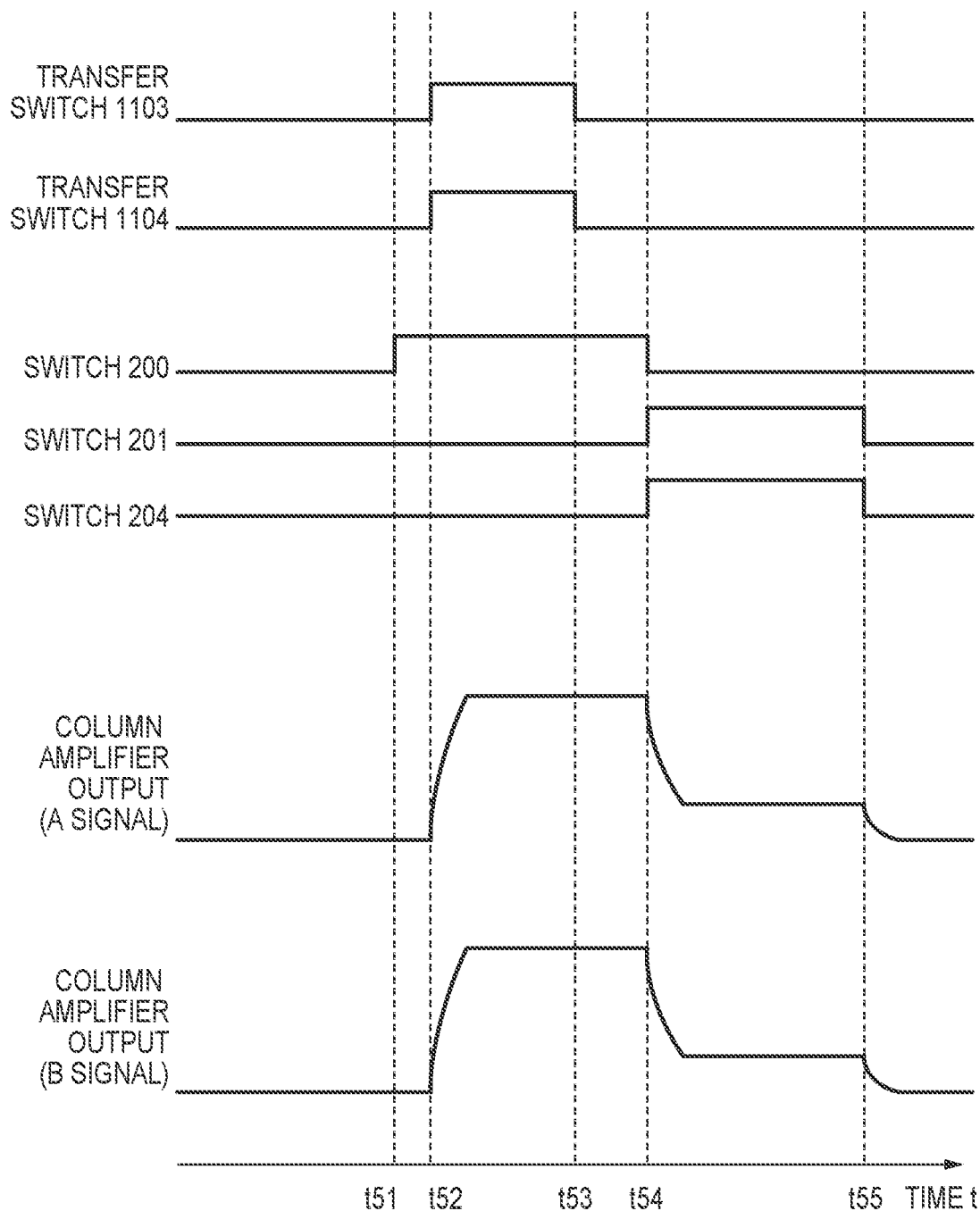
FIG. 18 is a timing chart illustrating control of a column amplifier when reading out partial signals at high gain and low gain from two photoelectric conversion elements in parallel, according to the fifth embodiment.

FIG. 18 is a timing chart illustrating control of the column amplifier 103$i$, carried out when high gain and low gain partial signals are read out in parallel from the photoelectric conversion elements 1101 and 1102 in the configuration illustrated in FIG. 17.

First, from time t51 to t54, the gain of the column amplifier 103$i$ is set to a high gain by turning the switch 200 on and turning the switches 201 and 204 off. In this state, the transfer switches 1103 and 1104 are turned on at time t52, and the A signal and B signal are read out. At this time, the A signal and the B signal read out at a high gain are A/D converted by the A/D circuit 104$i$ during the period from time t52 to t54.

Next, from time t54 to t55, the gain of the column amplifier 103$i$ is set to a low gain by turning the switch 200 off and turning the switches 201 and 204 on. At this time, the A signal and B signal read out at a low gain are A/D converted by the A/D circuit 104$i$ during the period from time t54 to t55.

Among the read-out high gain A signal, high gain B signal, low gain A signal, and low gain B signal, the high gain A+B signal is generated by the signal processing unit 106 illustrated in FIG. 1A by adding the high gain A signal and the high gain B signal, and is then output. Additionally, the low gain A+B signal is generated by the signal processing unit 106 by adding the low gain A signal and the low gain B signal, and is then output.

Although the timing chart illustrated in FIG. 18 indicates a case where both high gain and low gain signals are read out, the present invention is not limited thereto. For example, the readout speed can be increased by reading out only the signals with the necessary gain, such as when the high gain signal is not necessary, the low gain signal is not necessary, or the like.

According to the present fifth embodiment as described thus far, an image signal used for dynamic range expansion and an image signal used for phase difference detection can be obtained in each frame, without reducing the framerate.

If the low gain A+B signal is to be interpolated using the image signals from the pixels above and below, the interpolation ratio of the pixels above and below may be changed as desired in accordance with the circumstances.

Sixth Embodiment

Figure 19:
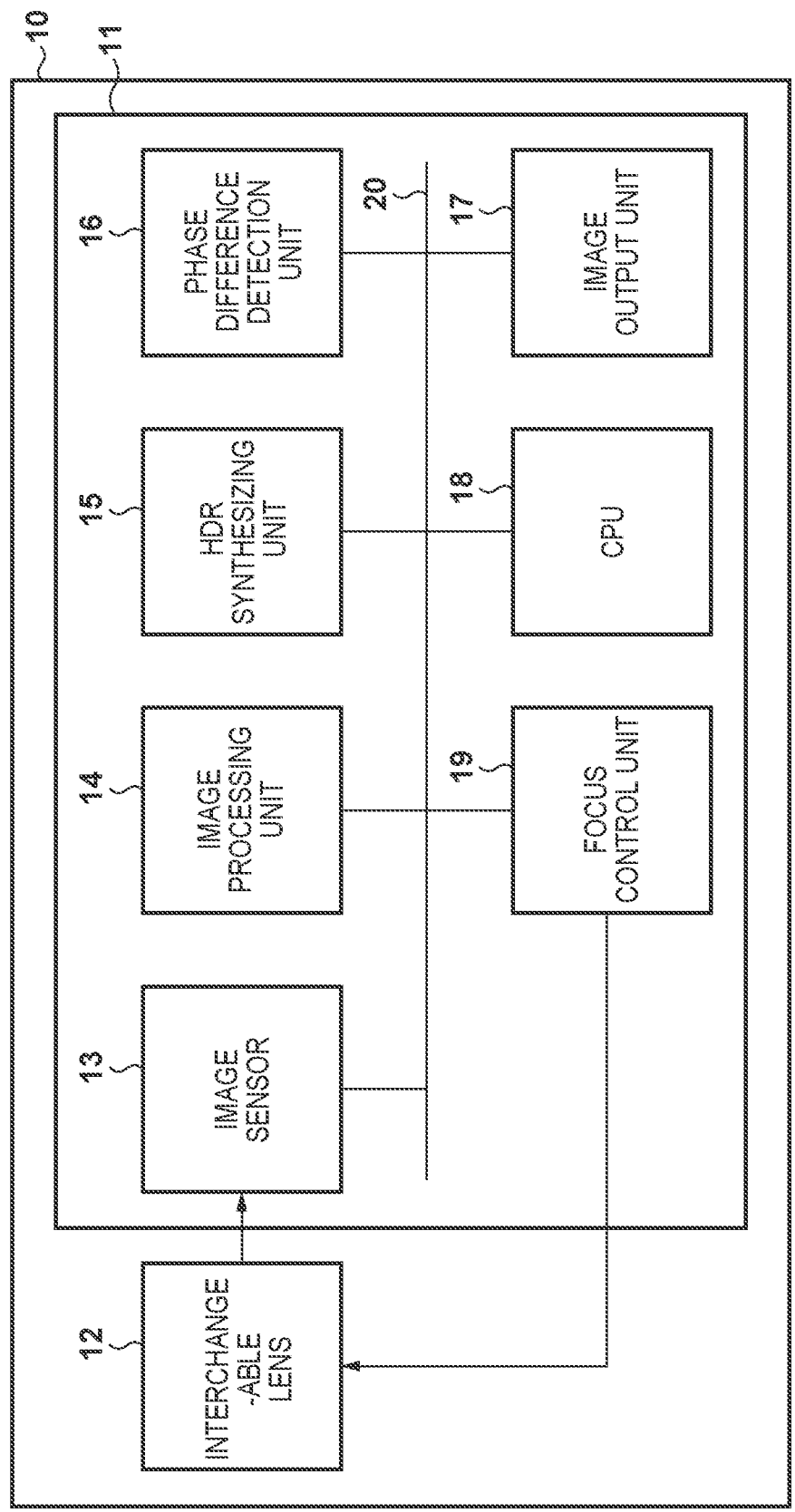
FIG. 19 is a block diagram illustrating a configuration of an image capturing system according to a sixth embodiment of the present invention.

A sixth embodiment of the present invention will be described next. FIG. 19 is a block diagram illustrating an image capturing system 10 according to the sixth embodiment, which is constituted primarily by a main body 11 and an interchangeable lens 12 that can be removed from the main body 11.

The interchangeable lens 12 is a shooting lens constituted by a group of a plurality of lenses, and includes a focus lens, a zoom lens, and a shift lens in addition to an aperture. The focal length of the interchangeable lens 12 can be changed by electrical signals from a focus control unit 19 (described later).

The main body 11 includes an image sensor 13, an image processing unit 14, an HDR synthesizing unit 15, a phase difference detection unit 16, an image output unit 17, a CPU 18, the focus control unit 19, and a bus 20. The connection parts for the interchangeable lens 12, the image output unit 17, and the like are exposed on the surface of the main body 11.

The image sensor 13 is configured as illustrated in FIGS. 1, 2A, and 2B, described above.

The image processing unit 14 corrects level differences produced by the image sensor 13. For example, the level of pixels in an active region are corrected using pixels in an optical black (OB) region, and defective pixels are corrected using neighbor pixels. The image processing unit 14 also performs various types of processes such as correction for decreases in ambient light amounts, color correction, edge enhancement, noise reduction, gamma correction, gain, and so on. The image processing unit 14 carries out these processes on RAW image data output from the image sensor 13, and outputs the corrected image data to various other units.

The HDR synthesizing unit 15 carries out HDR synthesizing (described later) using the high gain A signal, low gain A signal, high gain A+B signal, and low gain A+B signal obtained by driving the image sensor 13 as illustrated in FIG. 3. An HDR-A signal and an HDR-(A+B) signal having expanded dynamic ranges are generated as a result. The processing by the HDR synthesizing unit 15 according to the present embodiment will be described in detail later with reference to FIGS. 20A and 20B.

The phase difference detection unit 16 obtains an HDR-B signal for each unit pixel 101, from the HDR-A signal and the HDR-(A+B) signal obtained from the HDR synthesizing unit 15. The HDR-A signals from the unit pixels 101 are collected to generate an A image signal, and the HDR-B signals from the unit pixels 101 are collected to generate a B image signal. A correlation between the A image signal and the B image signal is then computed to calculate information such as a defocus amount, various types of reliabilities, and so on. A defocus amount on the image plane is calculated as the defocus amount, on the basis of shift between the A image signal and the B image signal. The defocus amount has a positive or negative value, and whether the focus is in front of the subject or behind the subject can be determined by whether the defocus amount has a positive value or a negative value. The extent to which the subject is out of focus can be determined from the absolute value of the defocus amount, and the subject is determined to be in focus when the absolute value of the defocus amount is within a prescribed value near 0. The phase difference detection unit 16 outputs information indicating whether the focus is in front of the subject or behind the subject to the CPU 18 on the basis of the calculated defocus amount. Additionally, information indicating the degree of focus, corresponding to the degree to which the subject is out of focus, is output to the CPU 18 and the like on the basis of the absolute value of the defocus amount. The information as to whether the focus is in front of the subject or behind the subject is output when the defocus amount is greater than a prescribed value, and information indicating that the subject is in focus is output when the absolute value of the defocus amount is within the prescribed value.

The CPU 18 adjusts the focus by controlling the interchangeable lens 12 through the focus control unit 19 in accordance with the defocus amount found by the phase difference detection unit 16.

The image output unit 17 outputs the image signal synthesized by the HDR synthesizing unit 15 to the exterior of the image capturing system 10. In addition to adjusting the focus as mentioned here, the CPU 18 controls the various units in the image capturing system 10 in accordance with control software.

The constituent elements described thus far are connected to the internal bus 20, which is a transfer path for control signals, data signals, and the like among the constituent elements.

Figure 20A:
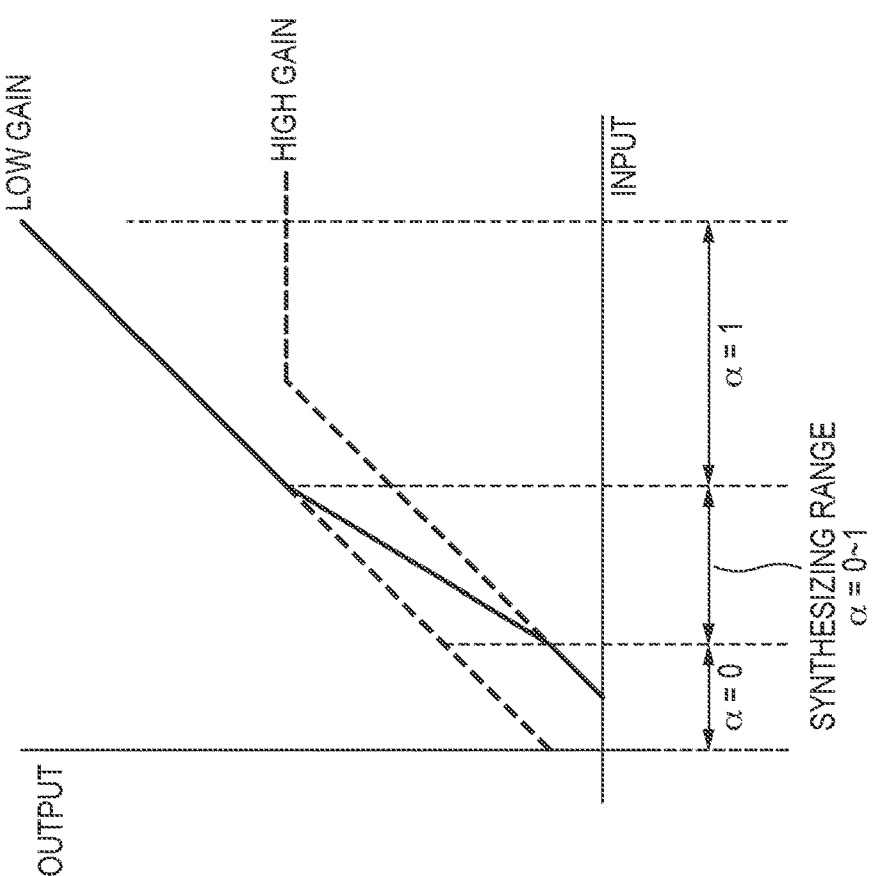
FIGS. 20A and 20B are diagrams illustrating a concept of an HDR synthesizing process according to the sixth embodiment.
Figure 20B:
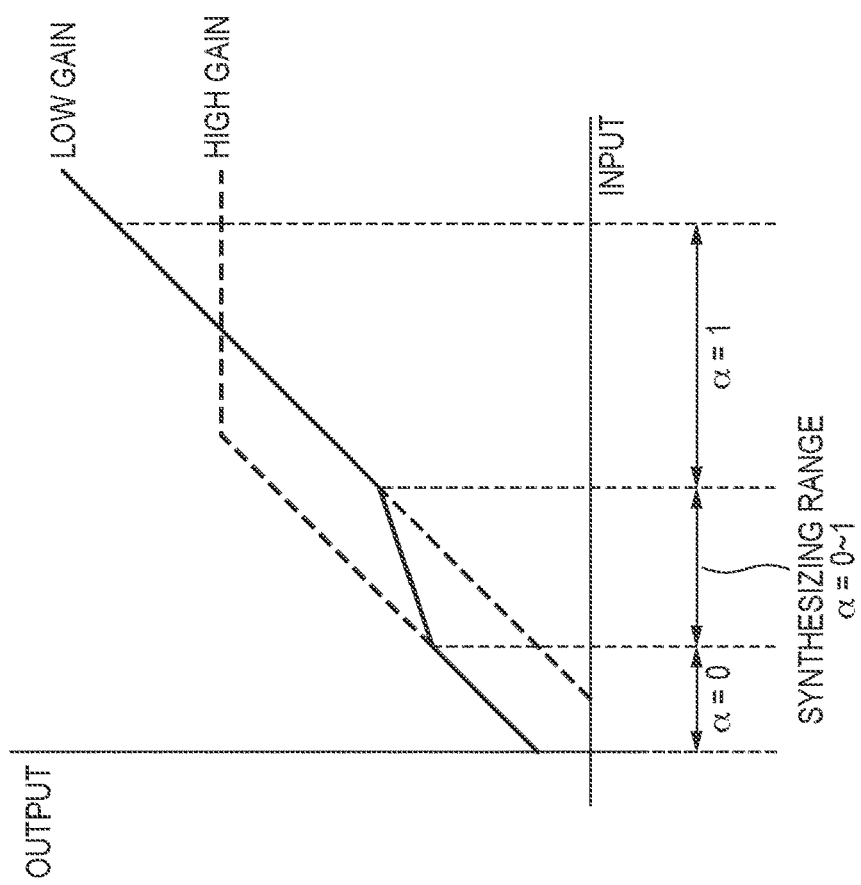

FIGS. 20A and 20B are graphs illustrating the concept of an HDR synthesizing process based on the input luminosities of image signals input to the HDR synthesizing unit 15 (the high gain A+B signal and the low gain A+B signal). FIG. 20A is a graph illustrating a case where offset of the high gain A+B signal is higher than offset of the low gain A+B signal, whereas FIG. 20B is a graph illustrating a case where the offset of the high gain A+B signal is lower than the offset of the low gain A+B signal.

In the present embodiment, the HDR synthesizing unit 15 carries out operations in accordance with the luminosities of the high gain A+B signal and the low gain A+B signal input for each pixel. The high gain A+B signal and the low gain A+B signal are obtained by applying different gains to the same A+B signal, and thus the luminosities corresponding to the high gain A+B signal and the low gain A+B signal are the same. Accordingly, the high gain A+B signal and the low gain A+B signal are subjected to HDR synthesis by applying different weights depending on the luminosity.

When the luminosity of the A+B signal is within a predetermined synthesizing range as indicated in FIGS. 20A and 20B, the input high gain A+B signal is multiplied by a weighting coefficient $(1-\alpha)$, and the low gain A+B signal by a coefficient $\alpha$, after which the signals are added and output. At this time, the value of $\alpha$ is varied in a linear manner between 0 and 1 in accordance with the luminosity within the synthesizing range, with $\alpha$ being 0 at minimum luminosity and $\alpha$ being 1 at maximum luminosity in the synthesizing range. On the other hand, if the luminosity is lower than the synthesizing range, the high gain A+B signal is multiplied by the coefficient $(1-\alpha)$, and the low gain A+B signal by the coefficient $\alpha$, assuming $\alpha=0$, after which the signals are added and output. In other words, the high gain A+B signal is output. If the luminosity is higher than the synthesizing range, the high gain A+B signal is multiplied by the coefficient (1−α), and the low gain A+B signal by the coefficient α, assuming α=1, after which the signals are added and output. In other words, the low gain A+B signal is output.

Here, it is also conceivable to carry out the HDR synthesizing on the high gain A signal and the low gain A signal according to characteristics such as those indicated in FIGS. 20A and 20B. However, if there is a difference between the offsets of the low gain A+B signal and the high gain A+B signal as indicated in FIGS. 20A and 20B, a problem arises in that the linearity of the input luminosity and the output luminosity cannot be ensured between the synthesizing range and parts not in the synthesizing range. This problem will be described next, using a case where the offset of the high gain signal is higher than the offset of the low gain signal as an example.

Figure 21:
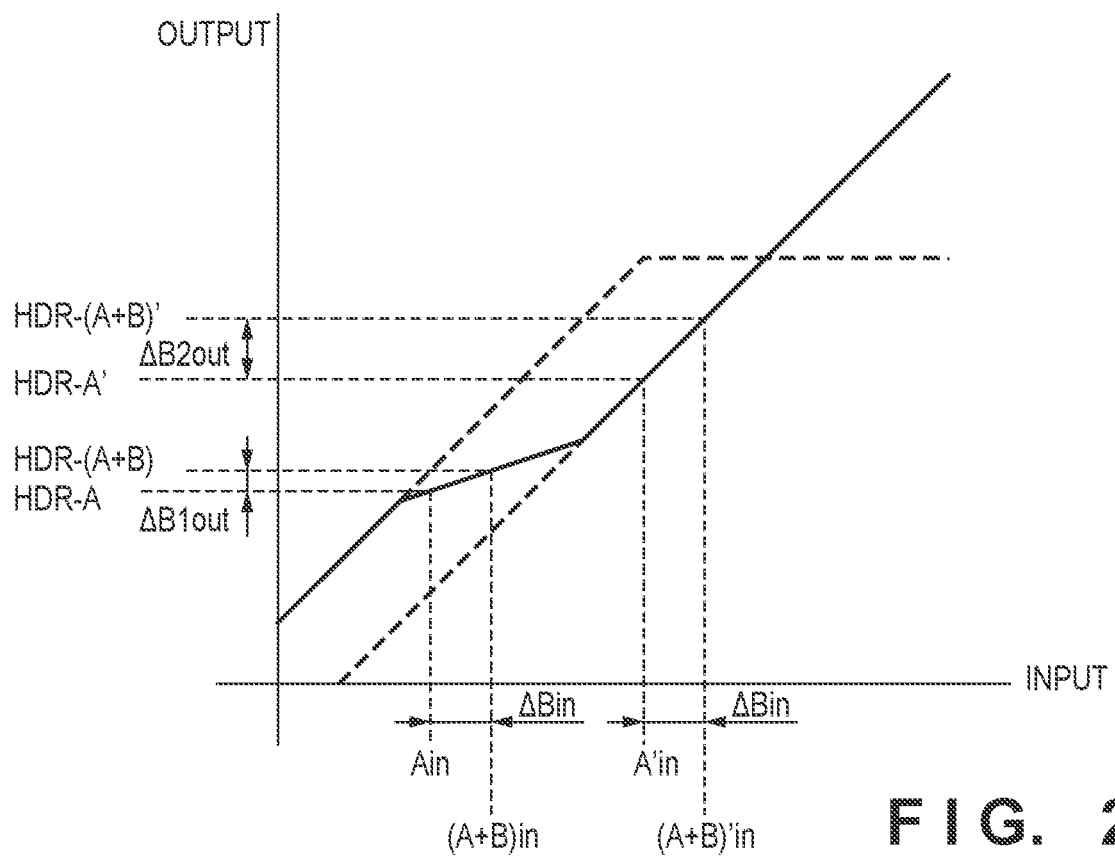
FIG. 21 is a diagram illustrating a problem arising when the sixth embodiment is not applied.

For example, when the luminosities corresponding to the A signal and the (A+B) signal are within the synthesizing range for a given unit pixel as indicated in FIG. 21, if the luminosities of the input signals are represented by Ain and (A+B)in, respectively, the output signals are the HDR-A signal and the HDR-(A+B) signal. Here, assuming a luminosity difference ΔBin (=(A+B)in−Ain) for the input signal corresponding to the B signal, the post-synthesis HDR-B signal is obtained from (HDR-(A+B) signal)−(HDR-A signal). This will be called "ΔB1out" for the sake of simplicity.

Meanwhile, assume that luminosities A'in and (A+B)'in, which respectively correspond to the A signal and the (A+B) signal for a given pixel, are higher than the synthesizing range, and the luminosity difference of an input signal corresponding to the B signal is the same as the above-described luminosity difference ΔBin. In this case, the post-HDR synthesizing HDR-B signal is (HDR-(A+B)'signal)−(HDR-A'signal). This will be called "ΔB2out" for the sake of simplicity. In this manner, although HDR-B signals for the same luminosity difference ΔBin should have the same value, the signals ultimately have different values, as indicated by ΔB2out and ΔB1out.

If the luminosities of the A signal and the (A+B) signal in each pixel are both outside the synthesizing range, a post-HDR synthesis signal is generated by applying the same weighting to the A signal and the (A+B) signal. However, if even one of these is within the synthesizing range, different weights are applied to the A signal and the (A+B) signal, resulting in different values. Thus if different HDR-B signals have been obtained for the same B signal, the correlation amount cannot be detected correctly, and thus the correct defocus amount cannot be obtained.

Figure 22:
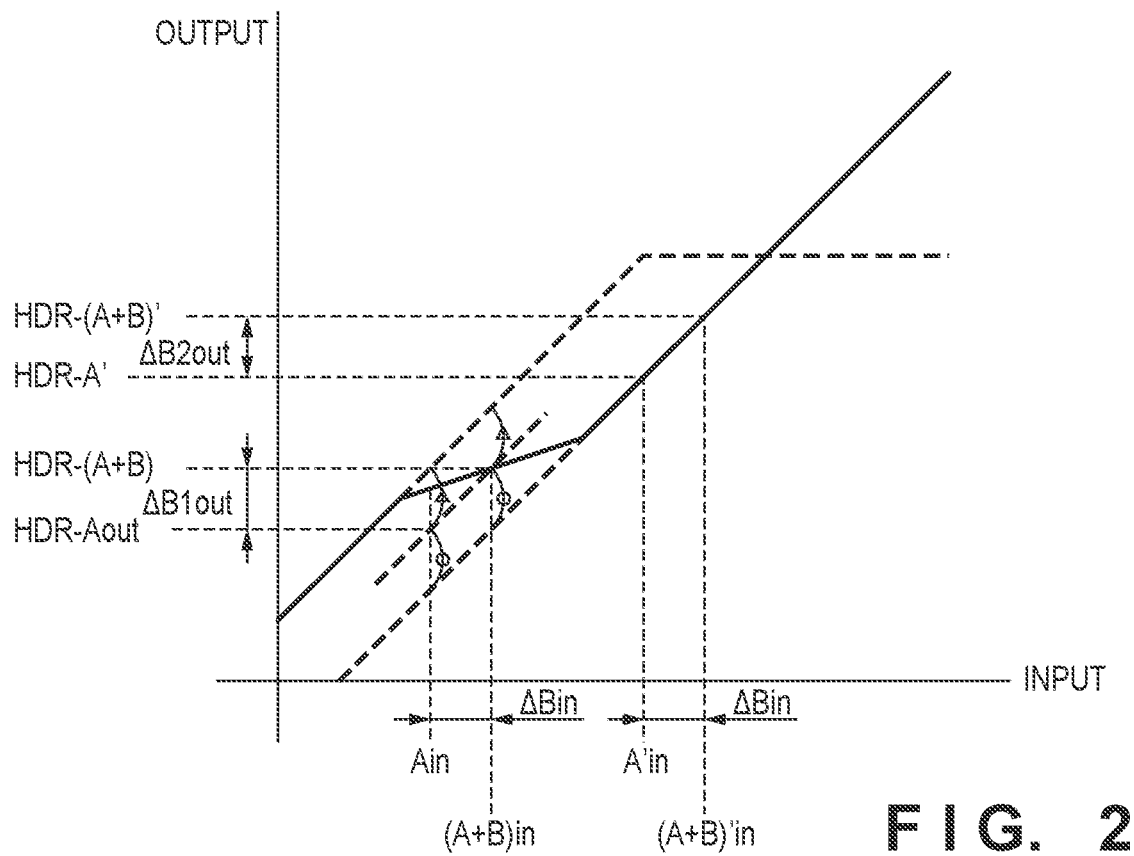
FIG. 22 is a diagram illustrating an example of an input luminosity and an output luminosity of an HDR synthesizing unit when the sixth embodiment is applied.

Accordingly, in the present embodiment, if the luminosity corresponding to the A signal is lower than the luminosity corresponding to the A+B signal in the same unit pixel but the A signal is subjected to HDR synthesizing, the HDR synthesizing is carried out using the same coefficient α as that used when subjecting the A+B signal output from the same unit pixel to the HDR synthesizing. FIG. 22 is a diagram illustrating this HDR synthesizing process.

As illustrated in FIG. 22, when subjecting the high gain A signal and the low gain A signal to HDR synthesizing, using the same coefficient α as that used when subjecting the high gain A+B signal and the low gain A+B signal from the same unit pixel to HDR synthesizing results in the slope within the synthesizing range being the same as the slope outside of the synthesizing range. As such, the same ΔB2out and ΔB1out can be obtained for the same B signal, i.e., the same HDR-B signal can be obtained.

Figure 23:
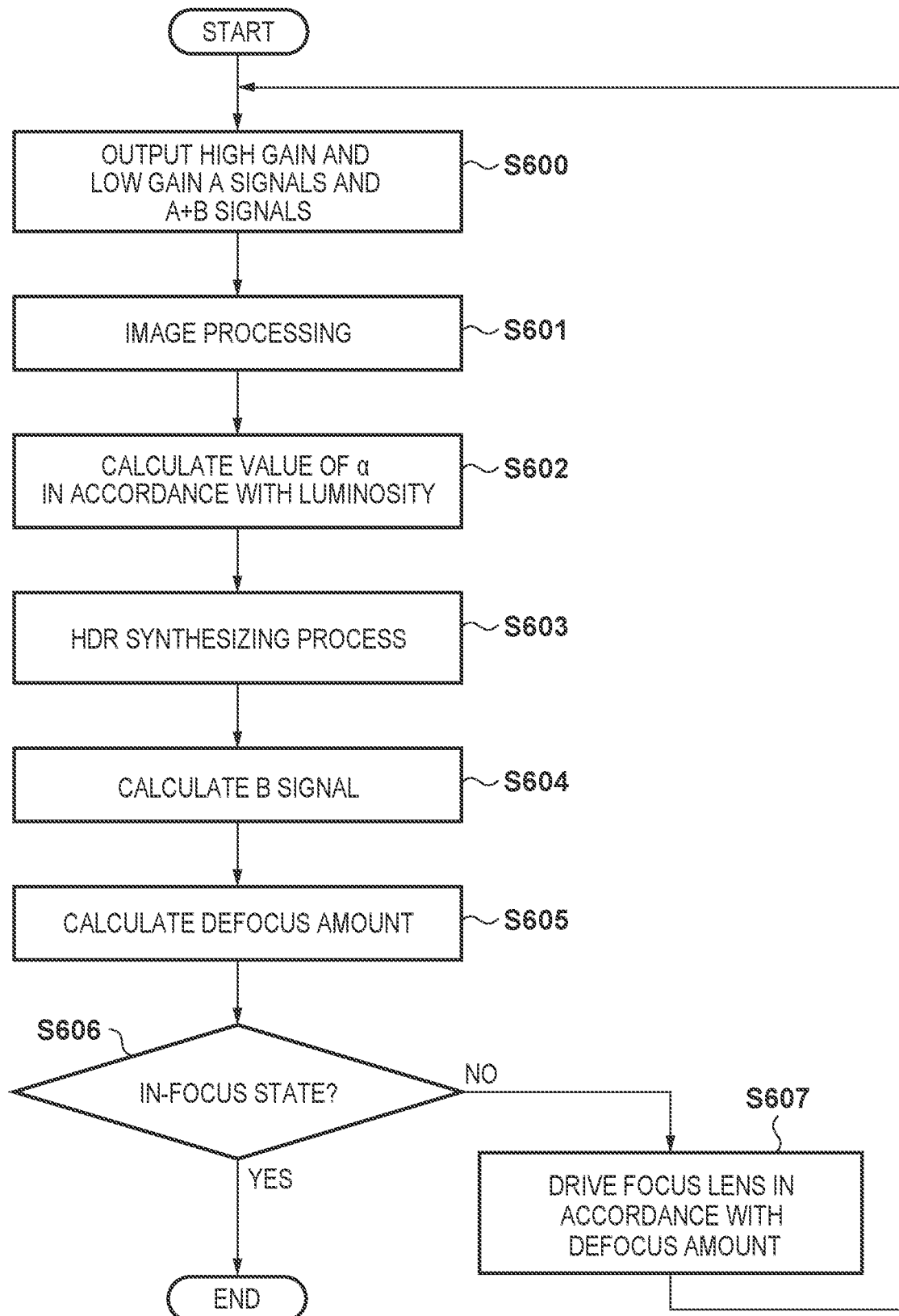
FIG. 23 is a flowchart illustrating operations of the image capturing system according to the sixth embodiment.

Next, operations from the readout of signals from the image sensor 13 to the on-image plane phase difference AF according to the sixth embodiment will be described using FIG. 23.

First, in step S600, the image sensor 13 photoelectrically converts a subject optical image formed by the interchangeable lens 12 at each pixel, and outputs the A signal and the A+B signal as described above. Different gains are applied to the A signal and the A+B signal by the column amplifier group 103, after which the signals undergo analog-digital conversion by the A/D circuit group 104, and the high gain A signal, the low gain A signal, the high gain A+B signal, and the low gain A+B signal are output as a result.

Next, in step S601, the image processing unit 14 corrects the level of pixels in the active region, corrects defective pixels using pixels located in the periphery thereof, and performs correction for decreases in ambient light amounts, color correction, edge enhancement, noise removal, and gamma correction on the high gain A+B signal and the low gain A+B signal. The low gain A+B signal and the low gain A signal are then subjected to gain correction to provide the same gain for the high gain A+B signal and the high gain A signal, after which the process moves to step S602.

In step S602, the HDR synthesizing unit 15 finds the coefficient α to be used in the HDR synthesizing, for each of the unit pixels, in accordance with the luminosity of the low gain A+B signal processed by the image processing unit 14, after which the process moves to step S603.

In step S603, the HDR synthesizing unit 15 multiplies the low gain A+B signal by the coefficient α, multiplies the high gain A+B signal by the coefficient (1−α), and adds the signals to synthesize the signals. Likewise, using the value of the coefficient α used in the HDR synthesis of the low gain A+B signal and the high gain A+B signal from the same pixel, the low gain A signal is multiplied by the coefficient α, and the high gain A signal by the coefficient (1−α), after which the signals are added to synthesize the signals. The process then moves to step S604.

In step S604, the phase difference detection unit 16 calculates the HDR-B signal by subtracting the HDR-A signal from the synthesized HDR-(A+B) signal, and the process then moves to step S605.

In step S605, the phase difference detection unit 16 calculates the on-image plane defocus amount by finding the phase difference between the HDR-A signal and the HDR-B signal, after which the process moves to step S606.

In step S606, the CPU 18 determines whether or not the focus state is an in-focus state from the calculated defocus amount, and if the focus state is an in-focus state, the process ends, where as if the focus state is not an in-focus state, the process moves to step S607.

In step S607, the focus control unit 19 changes the focal length of the interchangeable lens 12 in accordance with the defocus amount, after which the process returns to step S600, and the processing described thus far is repeated.

According to the present sixth embodiment as described thus far, the low gain A signal and the high gain A signal, which are signals for phase difference detection, are subjected to HDR synthesizing using the same coefficient α as that used for the low gain A+B signal and the high gain A+B signal for image capturing, from the same pixel. This makes it possible to obtain the correct B signal without being affected by a shift between the low gain and high gain offsets. The defocus amount can therefore be calculated correctly, which makes it possible to carry out the on-imaging plane phase difference AF appropriately.

Seventh Embodiment

A seventh embodiment of the present invention will be described next. The configuration of an image capturing system according to the seventh embodiment is the same as that illustrated in FIG. 19, but the method for reading out signals from the image sensor 13, and the processing by the HDR synthesizing unit 15 and the phase difference detection unit 16, are different from the sixth embodiment. As such, the differences will be described below.

In the above-described sixth embodiment, the A+B signal and the A signal are output from each unit pixel in the image sensor 13. However, in the seventh embodiment, one A signal is output from the image sensor 13 for every eight pixels' worth of the A+B signal for image capturing.

FIGS. 24A and 24B are diagrams illustrating the concept of reading out the A+B signal and the A signal output from the image sensor 13. FIG. 24A illustrates the concept of the signals output from the image sensor 13 according to the sixth embodiment, where the A+B signal and the A signal are output from each unit pixel. By contrast, FIG. 24B illustrates the concept of the signals output from the image sensor 13 according to the seventh embodiment, where one A signal is output for every eight pixels' worth of the A+B signal. In the present seventh embodiment, the A signal is assumed to have a value obtained by taking the arithmetic mean of the eight pixels' worth of A signals corresponding to the eight pixels' worth of A+B signals. To distinguish this from the A signals output from each unit pixel, the A signal according to the seventh embodiment will be called an "A' signal" hereinafter.

The present invention is not limited to the arithmetic mean in this manner, and thinning readout may be used; additionally, the number of pixels is not limited to eight. For example, if one A' signal is to be output for 3×3, i.e., 9 pixels' worth of A+B signals, it is conceivable to use the A signal in the unit pixel in the center as the A' signal according to the seventh embodiment. Additionally, the number of pixels corresponding to a single A' signal may be changed in accordance with the frame rate of the image output from the image sensor 13, the total number of pixels output in a single frame period, and the like.

The HDR synthesizing unit 15 calculates the coefficient $\alpha$, which is used to synthesize the A+B signal, and a coefficient $\alpha'$, which is used to synthesize the A' signal. The coefficient $\alpha'$ is the average value of eight coefficients $\alpha$ calculated to subject the eight pixels' worth of high gain A+B signals and low gain A+B signals to HDR synthesizing, and a high gain A' signal and a low gain A' signal corresponding to those eight pixels are subjected to HDR synthesizing using the coefficient $\alpha'$.

Figure 25:
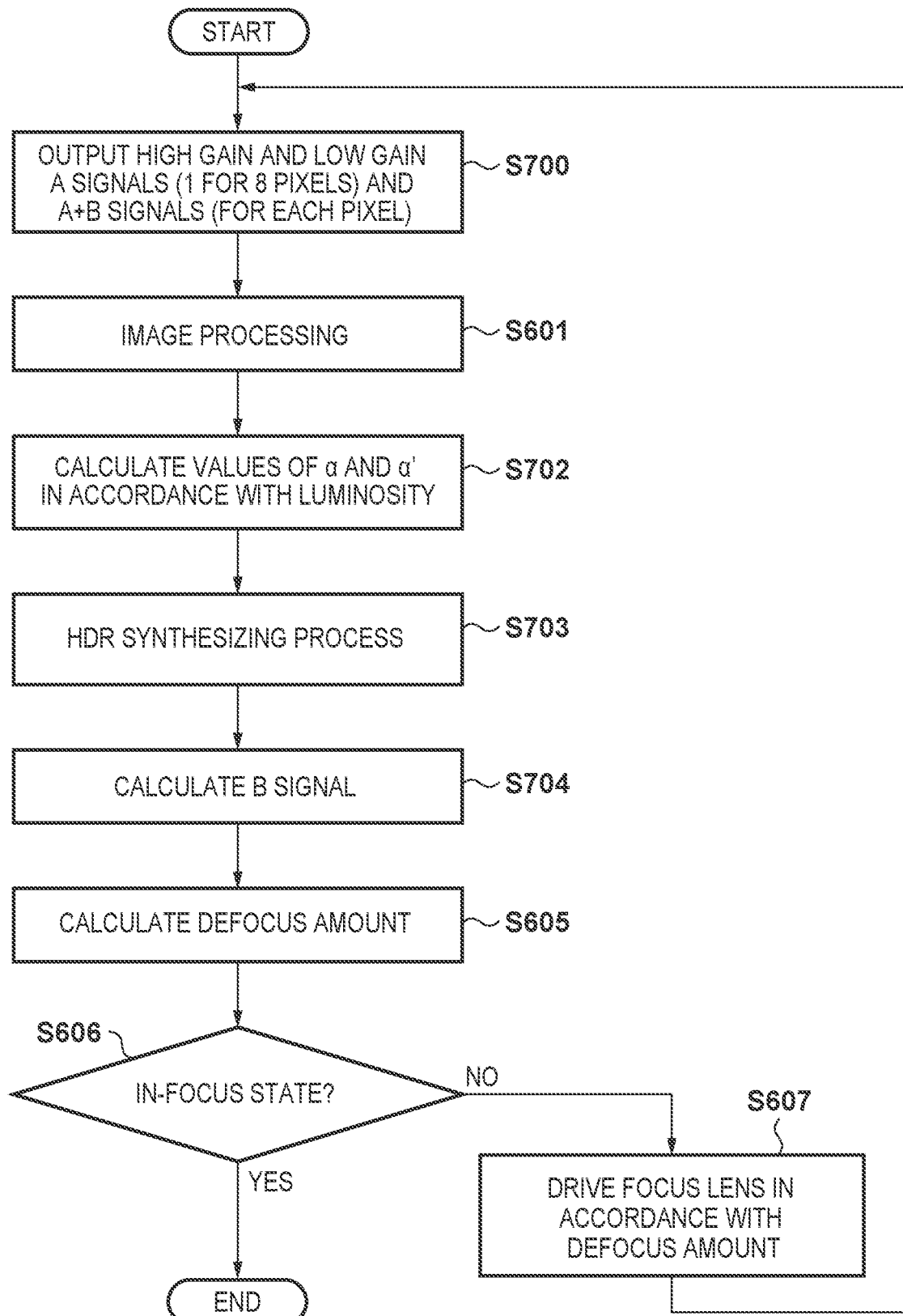
FIG. 25 is a flowchart illustrating operations of an image capturing system according to the seventh embodiment.

Next, operations from the readout of signals from the image sensor 13 to the on-image plane phase difference AF according to the seventh embodiment will be described using FIG. 25. Note that in FIG. 25, processes that are the same as those in the flowchart of FIG. 23 are given the same reference signs, and descriptions thereof are omitted as appropriate.

First, in step S700, a subject optical image formed by the interchangeable lens 12 is photoelectrically converted at the pixel level, and the A signals and the A+B signals are output as described above. The A' signal, which is the average value of the eight pixels' worth of A signals, is then found. Different gains are applied by the column amplifier group 103 to the A' signal and the A+B signal that have been found, after which the signals undergo analog-digital conversion by the A/D circuit group 104, and the high gain A+B signal and low gain A+B signal for each pixel, as well as the high gain A' signal and the low gain A' signal, are output. Next, in step S601, the processing described above with reference to FIG. 23 is carried out.

In step S702, the HDR synthesizing unit 15 calculates the coefficient $\alpha$ to be used in the HDR synthesizing, on a pixel-by-pixel basis, in accordance with the luminosities of the A+B signals from the eight pixels processed by the image processing unit 14. Furthermore, the coefficient $\alpha'$, which is the average value of the eight coefficients $\alpha$ for the eight pixels, is calculated, after which the process moves to step S703.

In step S703, the HDR synthesizing unit 15 multiplies the low gain A+B signal from each unit pixel by the coefficient $\alpha$ found in step S702, multiplies the high gain A+B signal by the coefficient $(1-\alpha)$, and adds the signals to synthesize the signals. On the other hand, using the coefficient $\alpha'$ obtained from the coefficients $\alpha$ for the eight corresponding pixels, the low gain A' signal is multiplied by the coefficient $\alpha'$, the high gain A' signal is multiplied by a coefficient $(1-\alpha')$, and the signals are added to synthesize the signals. The process then moves to step S704.

In step S704, the phase difference detection unit 16 calculates eight pixels' worth of the HDR-B signals by subtracting the synthesized HDR-A' signal from each of the HDR-(A+B) signals from the corresponding eight pixels, after which the process moves to step S605. The processing that follows thereafter is the same as that described in the sixth embodiment.

According to the present seventh embodiment as described thus far, the low gain A' signal and the high gain A' signal, which are signals for phase difference detection, are subjected to HDR synthesizing using the coefficient $\alpha'$, which is the average value of the coefficients $\alpha$ used when synthesizing the low gain A+B signals and the high gain A+B signals from a plurality of corresponding unit pixels. This makes it possible to obtain the correct B signal without being affected by a shift between the low gain and high gain offsets, even when a single A' signal is output for a plurality of A+B signals. The defocus amount can therefore be calculated correctly, which makes it possible to carry out the on-imaging plane phase difference AF appropriately.

Furthermore, although the present embodiment describes taking the simple average value of the coefficients $\alpha$ for the corresponding pixels as the coefficient $\alpha'$, an average value weighted in accordance with the luminosity sensitivity of each color may be used instead.

Additionally, although the above example describes using the A image signal obtained from the A signals and the B image signal obtained from the B signals for focus detection, the A image signal and the B image signal are not limited to being used in this manner. The signals can be used for other applications, such as generating a pair of signals having parallax for a three-dimensional display.

Although the foregoing has described preferred embodiments of the present invention, the present invention is not intended to be limited to the specific embodiments, and all variations that do not depart from the essential spirit of the invention are intended to be included in the scope of the present invention. Some of the above-described embodiments may be combined as appropriate.

Other Embodiments

The present invention may be applied in a system constituted by a plurality of devices (e.g., a host computer, an interface device, a scanner, a video camera, and the like) or in an apparatus constituted by a single device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-078625, filed on Apr. 16, 2018, No. 2019-021823, filed on Feb. 8, 2019, and No. 2019-021825, filed on Feb. 8, 2019 which are hereby incorporated by reference herein in their entirety.

What is claimed is:

1. An image capturing apparatus comprising:
an image sensor, the image sensor including a pixel region having a plurality of pixels each having a microlens and a plurality of photoelectric conversion portions, a scanning circuit that scans the pixel region to read out a signal from the plurality of pixels, an amplifier that can amplify the signal read out from the plurality of pixels by the scanning circuit by using a plurality of different gains including at least a first gain,
a controller that controls the image sensor;
a processor that expands a dynamic range using the signals amplified using the plurality of different gains; and
a focus detection circuit that carries out phase difference focus detection using the signals read out from the plurality of photoelectric conversion portions of each of the plurality of pixels,
wherein the scanning circuit independently reads out the signals of the plurality of photoelectric conversion portions of each pixel from each of the plurality of pixels, and
wherein the controller controls the image sensor such that in a case where a first mode for expanding the dynamic range by the processor and for carrying out the phase difference focus detection by the focus detection circuit is set, the amplifier amplifies the signals read out from the plurality of photoelectric conversion portions using the plurality of different gains, and the signals from the plurality of photoelectric conversion portions of each of the plurality of pixels amplified by the plurality of different gains are output, and
in a case where a second mode for not expanding the dynamic range by the processor and for carrying out the phase difference focus detection by the focus detection circuit is set, the amplifier amplifies the signals read out from the plurality of photoelectric conversion portions using the first gain, and the signals from the plurality of photoelectric conversion portions of each of the plurality of pixels amplified by the first gain are output.

2. The image capturing apparatus according to claim 1, wherein the image sensor further comprises an addition unit that adds the signals independently read out from the plurality of photoelectric conversion portions of each of the plurality of pixels.

3. An image capturing apparatus comprising:
an image sensor, the image sensor including a pixel region having a plurality of pixels each having a microlens and a plurality of photoelectric conversion portions, a scanning circuit that scans the pixel region to read out a signal from the plurality of pixels, an amplifier that can amplify the signal read out from the plurality of pixels by the scanning circuit by using a plurality of different gains including at least a first gain,
a controller that controls the image sensor;
a processor that expands a dynamic range using the signals amplified using the plurality of different gains; and
a focus detection circuit that carries out phase difference focus detection using the signals read out from the plurality of photoelectric conversion portions of each of the plurality of pixels,
wherein the scanning circuit independently reads out the signals of the plurality of photoelectric conversion portions of each pixel from each of the plurality of pixels, and
wherein the controller controls the image sensor such that in a case where a first mode for not expanding the dynamic range by the processor and for carrying out the phase difference focus detection by the focus detection circuit is set, the amplifier amplifies the signals read out from the plurality of photoelectric conversion portions using the first gain, and the signals from the plurality of photoelectric conversion portions of each of the plurality of pixels amplified by the first gain are output, and
in a case where a second mode for expanding the dynamic range by the processor and for not carrying out the phase difference focus detection by the focus detection circuit is set, the amplifier amplifies the signals read out from the plurality of pixels using the plurality of different gains, the signals from the plurality of photoelectric conversion portions of each of the plurality of pixels and being amplified by the plurality of different gains are output.

4. The image capturing apparatus according to claim 3, wherein the image sensor further comprises an addition unit that adds the signals independently read out from the plurality of photoelectric conversion portions of each of the plurality of pixels.

* * * * *